United States Patent
Whetsel

(10) Patent No.: US 7,825,695 B2
(45) Date of Patent: Nov. 2, 2010

(54) OR GATE CONNECTING LVDS COMPARATORS TO MULTIPLEXER

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/560,673

(22) Filed: Sep. 16, 2009

(65) Prior Publication Data

US 2010/0007385 A1    Jan. 14, 2010

Related U.S. Application Data

(62) Division of application No. 12/251,600, filed on Oct. 15, 2008, now Pat. No. 7,612,584, which is a division of application No. 11/555,349, filed on Nov. 1, 2006, now Pat. No. 7,453,283.

(60) Provisional application No. 60/733,571, filed on Nov. 4, 2005.

(51) Int. Cl.
  *H03K 19/0175* (2006.01)
(52) U.S. Cl. .................... 326/86; 326/83; 326/30; 327/108; 327/65
(58) Field of Classification Search .......... 326/30, 326/82–83, 86–87, 26, 14, 9; 327/108–109, 327/333, 236, 244, 65, 68, 70, 76–80, 82, 327/89, 90
See application file for complete search history.

(56) References Cited

U.S. PATENT DOCUMENTS

| | | | | |
|---|---|---|---|---|
| 4,859,872 A | * | 8/1989 | Hyakutake | 327/74 |
| 5,604,450 A | * | 2/1997 | Borkar et al. | 326/82 |
| 5,789,943 A | * | 8/1998 | Wong et al. | 326/82 |
| 6,288,577 B1 | * | 9/2001 | Wong | 327/65 |
| 6,320,406 B1 | * | 11/2001 | Morgan et al. | 326/14 |
| 6,690,196 B1 | * | 2/2004 | Cecchi et al. | 326/82 |
| 6,703,866 B1 | * | 3/2004 | Arimilli et al. | 326/86 |
| 6,803,790 B2 | * | 10/2004 | Haycock et al. | 326/82 |
| 6,876,229 B1 | * | 4/2005 | Barus et al. | 326/82 |
| 6,894,536 B2 | * | 5/2005 | Martin et al. | 326/63 |

* cited by examiner

*Primary Examiner*—James H. Cho
*Assistant Examiner*—Christopher Lo
(74) *Attorney, Agent, or Firm*—Lawrence J. Bassuk; W. James Brady; Frederick J. Telecky, Jr.

(57) ABSTRACT

First and second devices may simultaneously communicate bidirectionally with each other using only a single pair of LVDS signal paths. Each device includes an input circuit and a differential output driver connected to the single pair of LVDS signal paths. An input to the input circuit is also connected to the input of the driver. The input circuit may also receive an offset voltage. In response to its inputs, the input circuit in each device can use comparators, gates and a multiplexer to determine the logic state being transmitted over the pair of LVDS signal paths from the other device. This advantageously reduces the number of required interconnects between the first and second devices by one half.

5 Claims, 20 Drawing Sheets

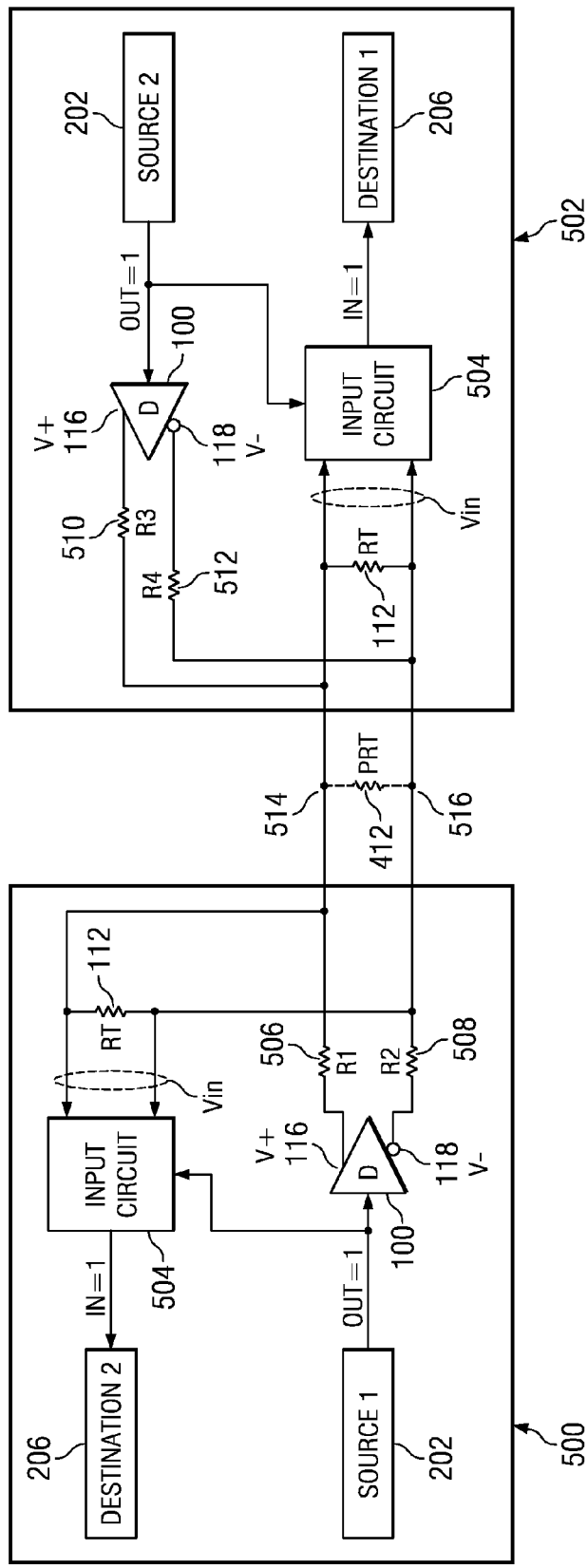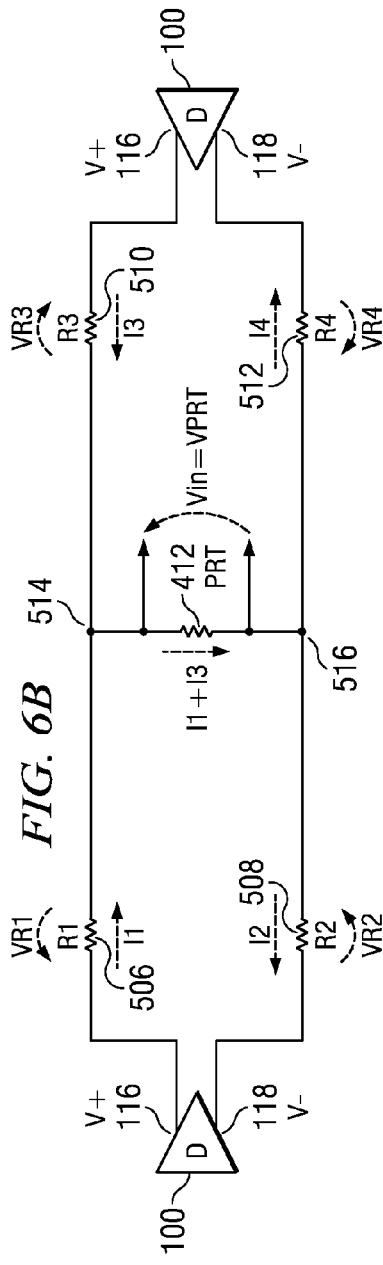
FIG. 6A
FIG. 6B

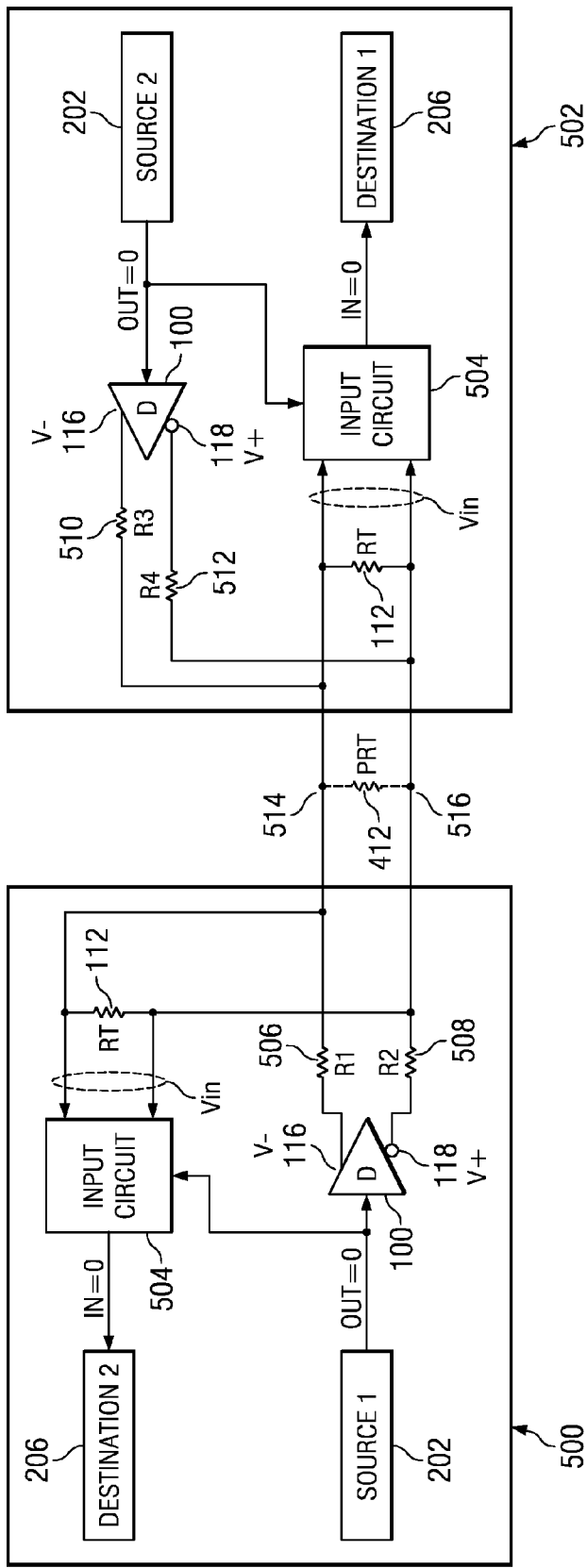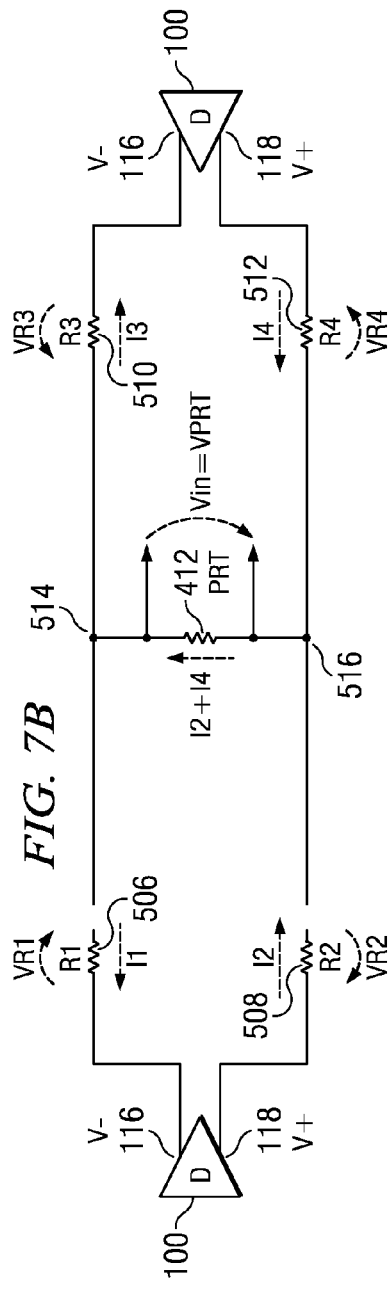
FIG. 7A
FIG. 7B

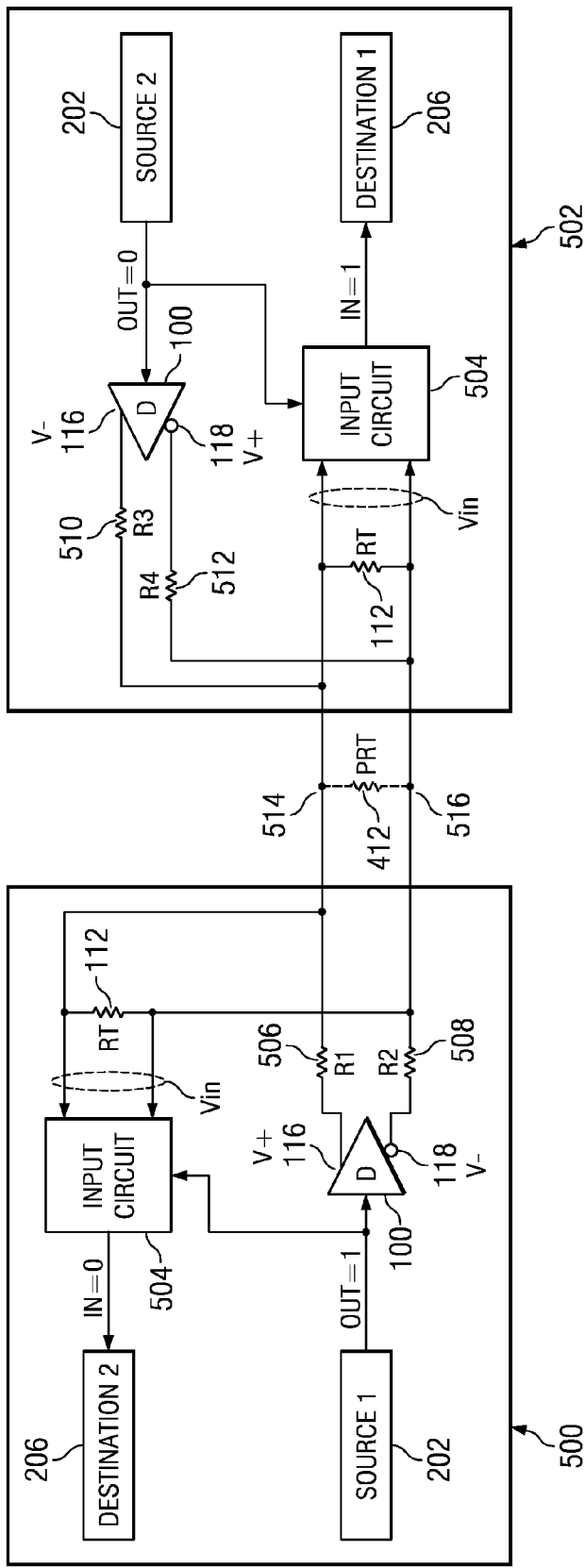
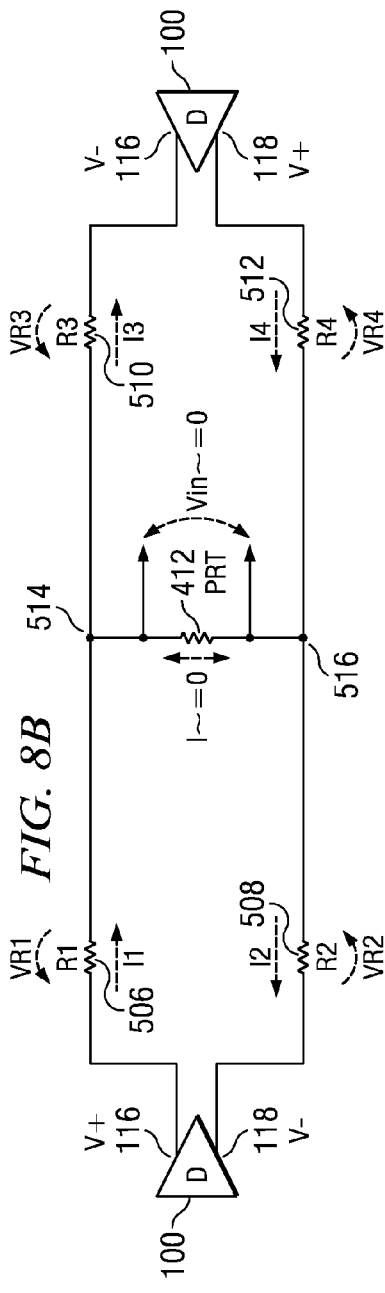
FIG. 8A
FIG. 8B

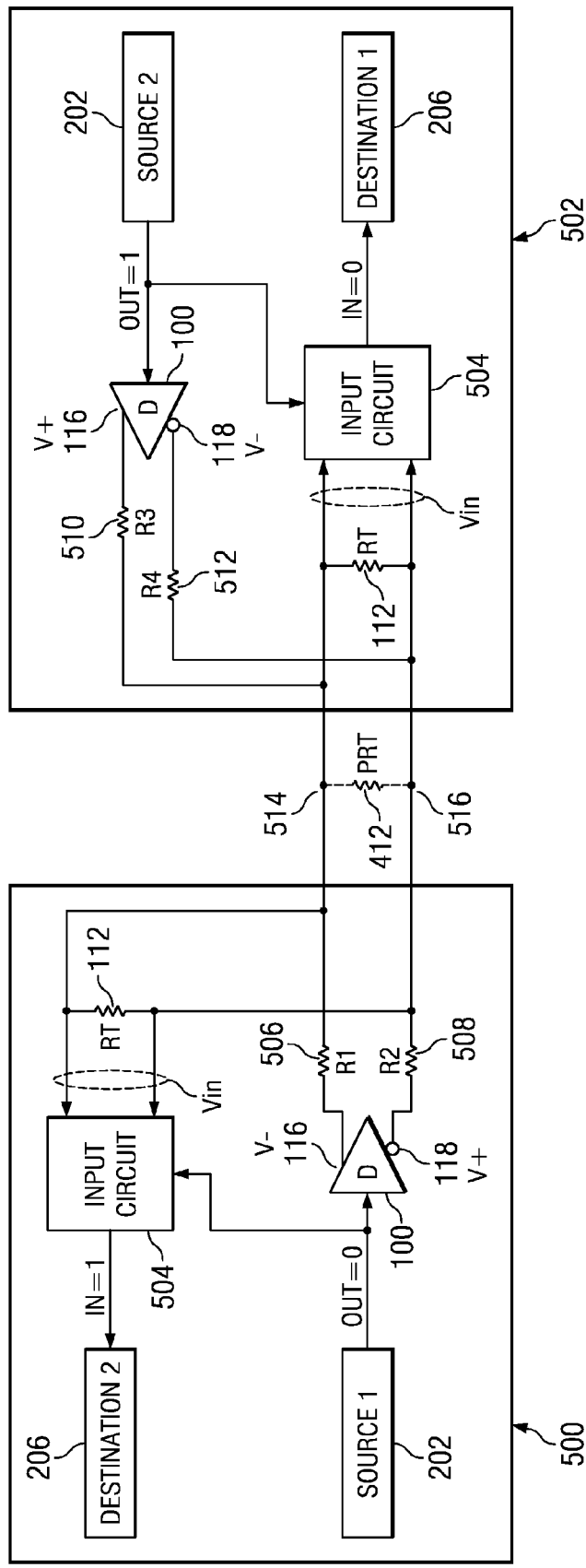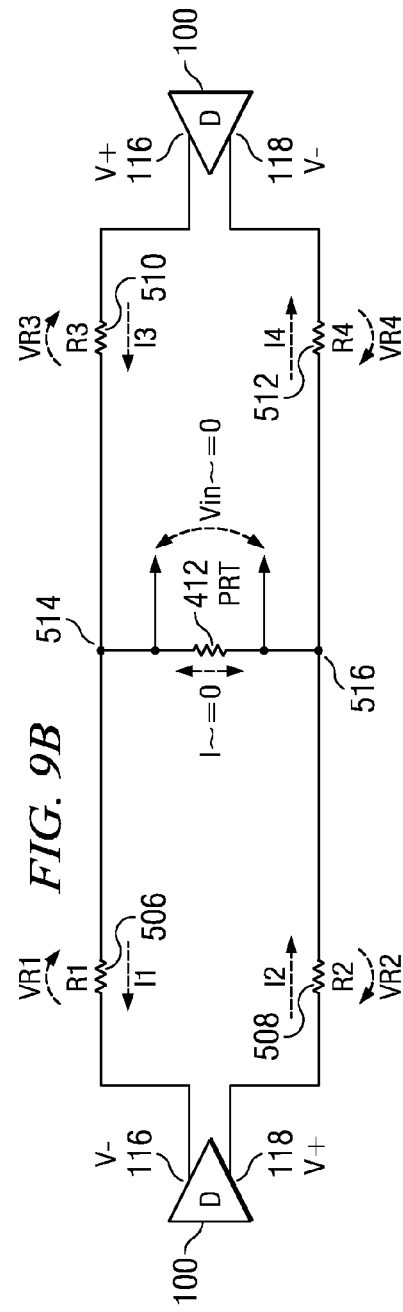
FIG. 9A
FIG. 9B

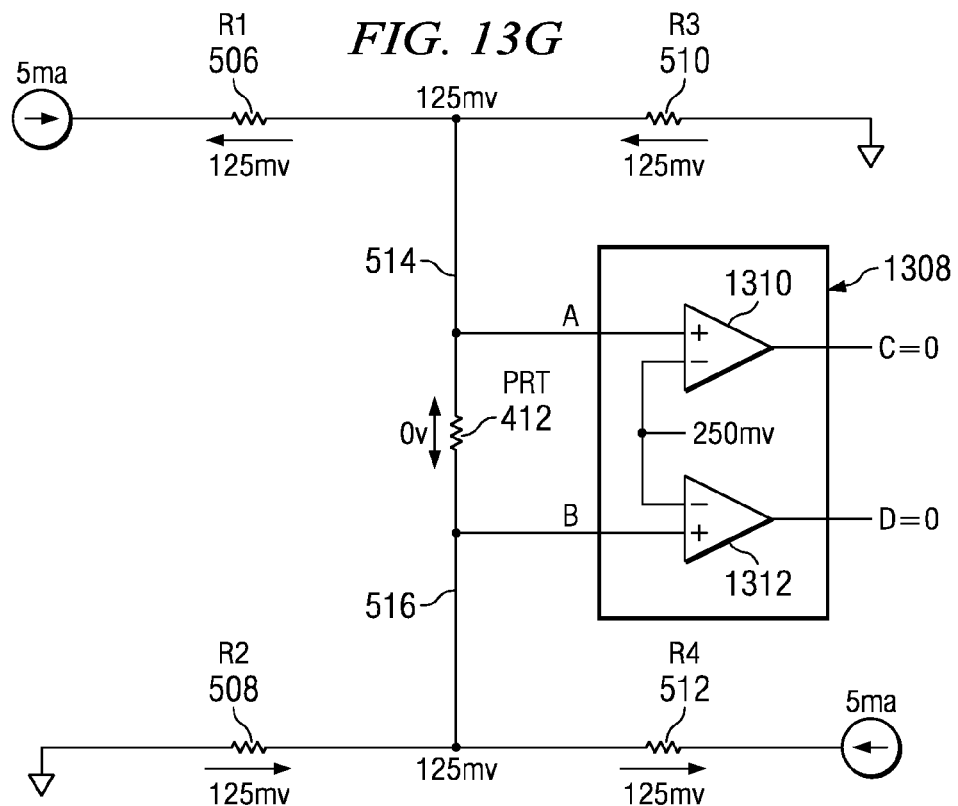
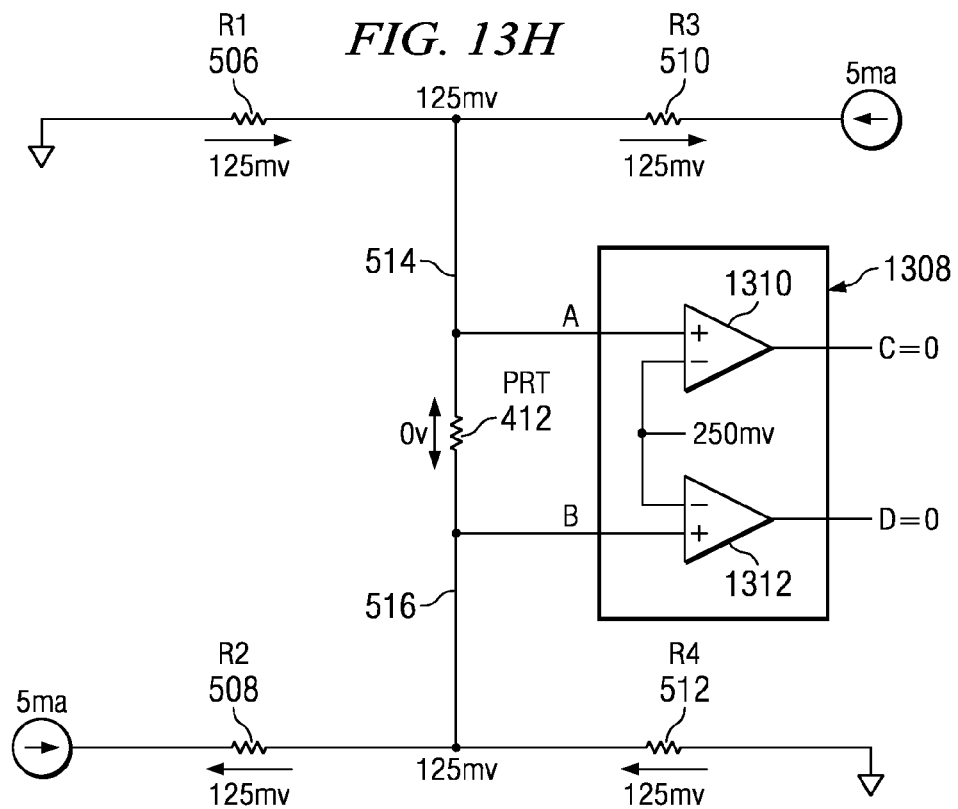

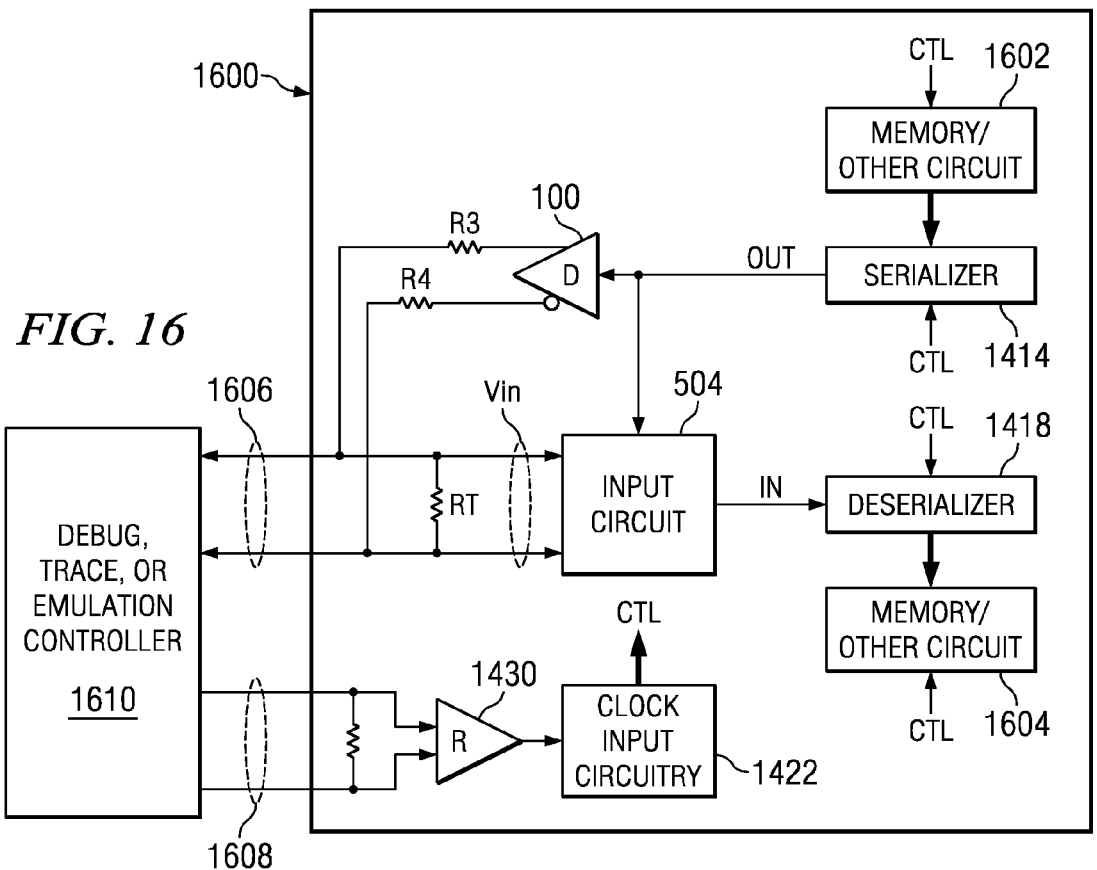

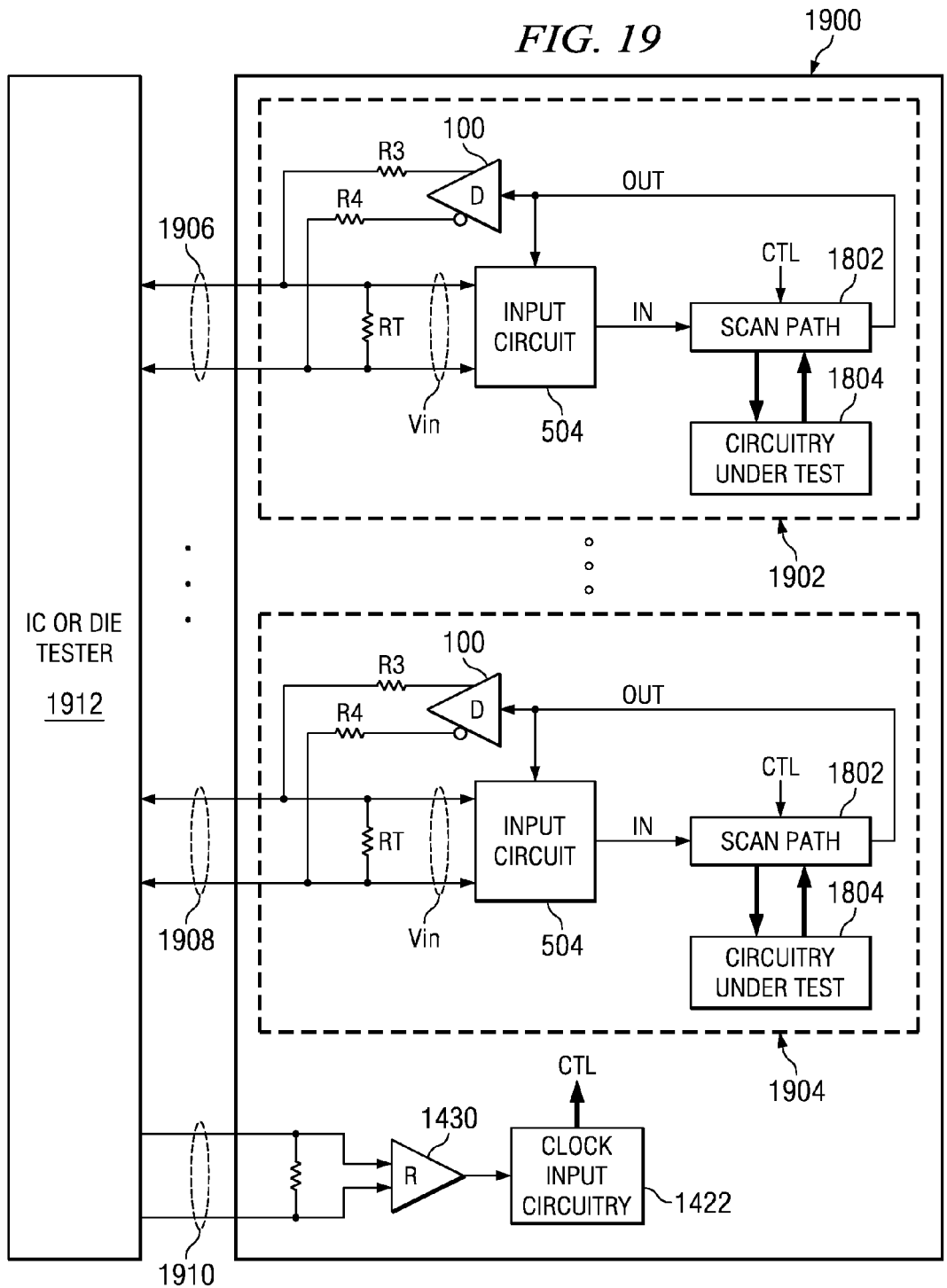

OR GATE CONNECTING LVDS COMPARATORS TO MULTIPLEXER

This application is a divisional of prior application Ser. No. 12/251,600, filed Oct. 15, 2008, now U.S. Pat. No. 7,612,584, issued Jan. 14, 2010;

which was a divisional of prior application Ser. No. 11/555,349, filed Nov. 1, 2006, now U.S. Pat. No. 7,453,283, granted Nov. 18, 2008;

which claims priority from Provisional Application No. 60/733,571, filed Nov. 4, 2005.

FIELD OF THE DISCLOSURE

This disclosure relates in general to circuit input and output differential signaling interfaces and in particular to interfaces based on Low Voltage Differential Signaling (LVDS).

BACKGROUND

Today LVDS signaling is being used in a myriad of circuit communication applications, including; (1) system to system communication via cable connections, (2) board to board communication via backplane connections, and (3) IC to IC communication via board or other substrate level connections. The present disclosure anticipates LVDS signaling applications to be extended, beyond these known applications, to include signaling applications between circuits (vender and custom circuits (cores)) embedded within ICs as well. The benefits of LVDS signaling over other (single ended) signaling schemes include; (1) improved signaling noise immunity, (2) lower signaling power consumption, and (3) higher signaling speeds. The drawback of LVDS signaling is that it doubles the number of connections required between a sending circuit and a receiving circuit. The present disclosure, in at least one aspect, eliminates this connection doubling drawback. Conventional LVDS signal communication occurs between an LVDS driver and an LVDS receiver over a pair of signal paths. The pair of signal paths may support bidirectional communication between two driver and receiver pairs, but not simultaneously.

BRIEF SUMMARY

The present disclosure discloses a design of LVDS drivers and receivers such that a pair of LVDS drivers and receivers can simultaneously communicate over a single pair of signal path leads.

A first device comprises a signal source 1, a signal destination 2, a LVDS driver, an input circuit, termination resistor, and a resistor in series with each of the differential signal paths. The input circuit receives inputs from the LVDS signal path and from an output from source 1. The input circuit provides input to destination 2.

A second device 502 comprises a signal source 2, a signal destination 1, an LVDS driver, an input circuit, a termination resistor, and a resistor in series with each of the differential signal paths. The input circuit receives inputs from the LVDS signal path and from an output from source 2. The input circuit provides input to destination 1.

A first example input circuit comprises an inverter with its input coupled to the output from the source circuit, a differential receiver with its non-inverting and inverting inputs coupled to the differential signal path, a window comparator with A and B inputs coupled to the differential signal path, and a multiplexer with a first input coupled to the output of the inverter, a second input coupled to the output of the differential receiver, a control input coupled to the output of the window comparator, and an output coupled to the input of the destination circuit.

A second example input circuit comprises an inverter with its input coupled to the output from the source circuit, a window comparator with A and B inputs the differential signal path, and a multiplexer. The multiplexer has a first input coupled to a fixed logic high, a second input coupled to a fixed logic low, a third input coupled to the output of the inverter, a first control input coupled to an output C of the window comparator, a second control input coupled to an output D of the window comparator, and an output coupled to the input to destination circuit.

One example circuit that could be used as window comparator comprises a first comparator with its non-inverting input coupled to the input A, its inverting input coupled to the input B, and its output coupled to the output C. A second comparator has its non-inverting input coupled to the input B, its inverting input coupled to the input A, and its output coupled to output D.

The first comparator is designed such that the voltage on its non-inverting input must be greater than the voltage on its inverting input by an offset voltage (OSV) value (80 millivolts in this example) before the comparator output C will go high. The second comparator is designed such that the voltage on its non-inverting input must be greater than the voltage on its inverting input by an offset voltage (OSV) value (80 millivolts in this example) before the comparator output D will go high. If the voltage difference on the A and B inputs is less than 80 millivolts, comparator outputs C and D go low. While 80 millivolts was used as an example OSV, any desired value of OSV may be used as well.

Another circuit that could be used to realize the window comparator comprises a first comparator with its non-inverting input coupled to the A input and its inverting input coupled to a reference voltage (assumed to be 250 mv in this example), a second comparator with its non-inverting input coupled to the B input and its inverting input coupled to the reference voltage, an OR gate with a first input coupled to the output of the first comparator, a second input coupled to the output of the second comparator, and an output coupled to the C output.

Another circuit that could be used to realize window comparator comprises a first comparator with its non-inverting input coupled to the A input, its inverting input coupled to a reference voltage (assumed to be 250 mv in this example), and an output coupled to the C output, a second comparator with its non-inverting input coupled to the B input, its inverting input coupled to the reference voltage, and an output coupled to the D output.

Each device comprises a deserializer for receiving serial data from the input circuit, data receiving circuitry for inputting parallel data from the deserializer, a serializer for inputting serial data to the driver, and data providing circuitry for inputting parallel data to the serializer. The combination of the data receiving circuitry and deserializer represent one example design for a destination circuit or a source circuit.

One of the devices also comprises clock output circuitry and an LVDS clock driver. The clock output circuitry provides a clock output to driver and outputs control (CTL) signals to operate the providing circuitry, serializer, deserializer, and receiving circuitry. The control (CTL) signals output to the serializer and deserializer from the clock output circuit will operate faster than the control signals to the receiving and providing circuits since they will be controlling the higher speed serial input and output operations occurring over the signal paths. The clock output circuit may employ use of clock and control signal modification circuits such as but not limited to; a phase lock loop, a phase shifter, a frequency divider, or a frequency multiplier. The clock driver is similar to the other drivers and drives LVDS clock outputs from the device on signal paths separate from the other signal paths. LVDS clocking is shown being used to provide high speed clock signals between the devices. If desired, single ended clocking could be used instead of the differential clocking shown, but the clocking frequency would be reduced between the devices. The device outputting the LVDS clock on the clock signal paths is assumed to be a master device.

BRIEF DESCRIPTION OF THE VIEWS OF THE DRAWINGS

FIG. 6A illustrates a first signal source communicating a logic 1 to a first signal destination simultaneous with a second signal source communicating a logic 1 to a second signal destination using one pair of LVDS signal paths according to the present disclosure.

FIG. 6B illustrates the electrical circuit model of the communication of FIG. 6A.

FIG. 7A illustrates a first signal source communicating a logic 0 to first signal destination simultaneous with a second signal source communicating a logic 0 to a second signal destination using one pair of LVDS signal paths according to the present disclosure.

FIG. 7B illustrates the electrical circuit model of the communication of FIG. 7A.

FIG. 8A illustrates a first signal source communicating a logic 1 to a first signal destination simultaneous with a second signal source communicating a logic 0 to a second signal destination using one pair of LVDS signal paths according to the present disclosure.

FIG. 8B illustrates the electrical circuit model of the communication of FIG. 8A.

FIG. 9A illustrates a first signal source communicating a logic 0 to a first signal destination simultaneous with a second signal source communicating a logic 1 to a second signal destination using one pair of LVDS signal paths according to the present disclosure.

FIG. 9B illustrates the electrical circuit model of the communication of FIG. 9A.

FIGS. 13E-13H illustrate a second example of how the window comparator of FIG. 12A may be designed.

FIG. 16 illustrates a first example of a device connected to a debug, trace, or emulation controller via an LVDS data signal path and an LVDS clock signal path according to the present disclosure.

FIG. 17 illustrates a second example of a device connected to a debug, trace, or emulation controller via an LVDS data signal path and an LVDS clock signal path according to the present disclosure.

FIG. 19 illustrates an example of a device connected to an IC or die tester via a plurality of LVDS data signal paths and an LVDS clock signal path according to the present disclosure.

DETAILED DESCRIPTION

Figure 1A:
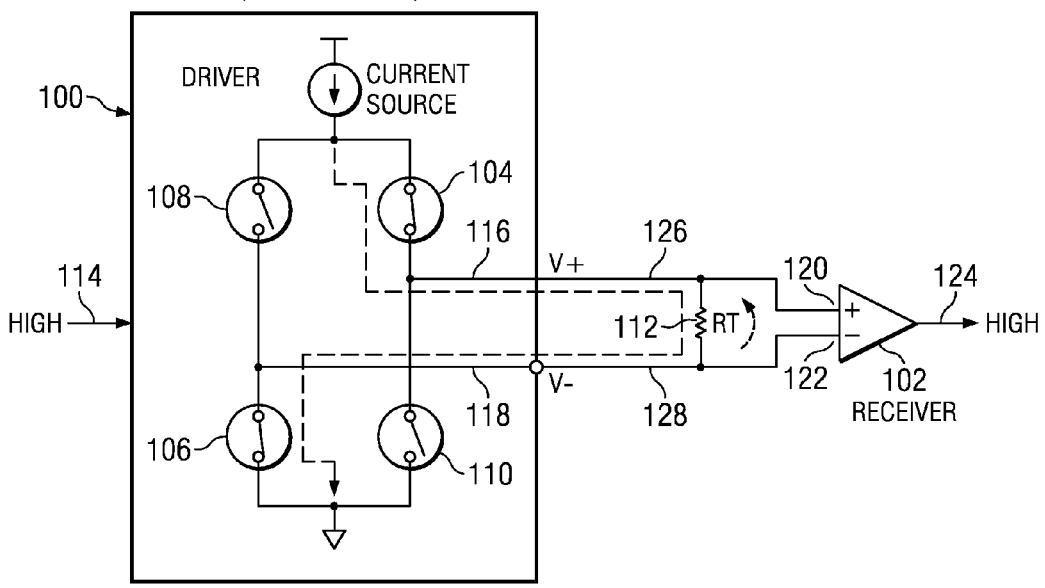
FIG. 1A illustrates a prior art LVDS driver communicating a logic one to a prior art LVDS receiver.
Figure 1B:
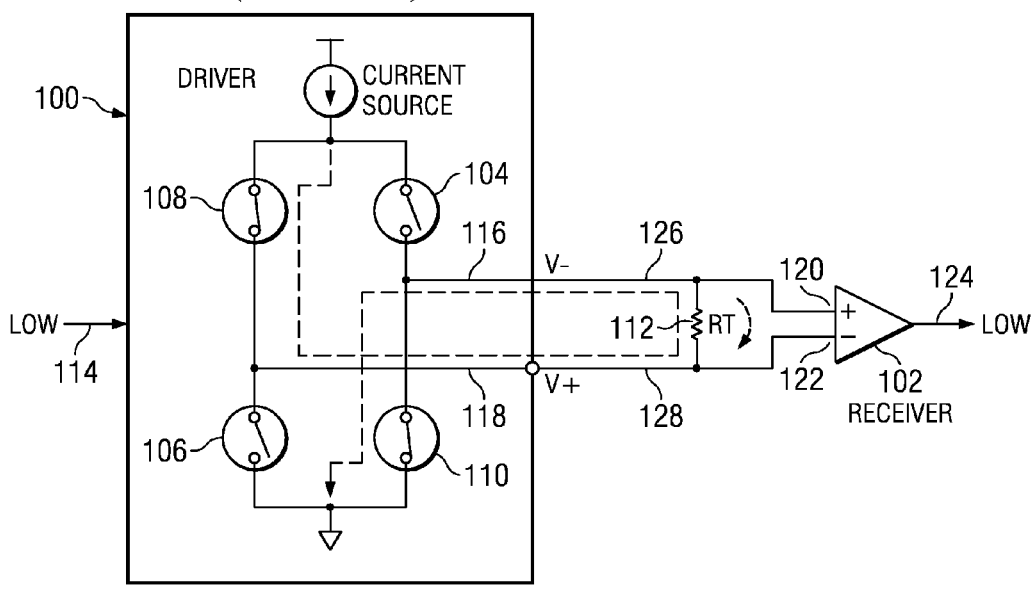
FIG. 1B illustrates a prior art LVDS driver communicating a logic zero to a prior art LVDS receiver.

FIGS. 1A and 1B illustrate the connection between a conventional LVDS driver 100 and receiver 102. The driver has an input 114, a non-inverting output 116 and an inverting output 118. The driver is comprised of transistors, indicated as switches 104-110, that are controlled by the input 114. The receiver has a non-inverting input 120, an inverting input 122, and an output 124. A first signal path connection 126 is formed between driver output 116 and receiver input 120. A second signal path connection 128 is formed between driver output 118 and receiver input 122. A termination resistor 112 is placed across the receiver inputs 120 and 122.

In FIG. 1A, a logic high is input to the driver. In response, transistors 104 and 106 are turned on and transistors 108 and 110 are turned off. In this arrangement current flows from the driver current source through transistor 104, termination resistor 112, and transistor 106. The direction of the current flow develops a voltage across termination resistor 112 such that the voltage at the receiver input 120 is more positive than the voltage at receiver input 122. In response to this input voltage, the receiver outputs a logic high on output 124.

In FIG. 1B, a logic low is input to the driver. In response, transistors 108 and 110 are turned on and transistors 104 and 106 are turned off. In this arrangement current flows from the driver current source through transistor 108, termination resistor 112, and transistor 110. The direction of the current flow develops a voltage across termination resistor 112 such that the voltage at the receiver input 122 is more positive than the voltage at receiver input 120. In response to this input voltage, the receiver outputs a logic low on output 124.

FIGS. 1A and 1B are provided to illustrate the conventional operation of current mode LVDS drivers and receivers. Voltage mode LVDS drivers and receivers may also be used, but current mode LVDS drivers and receivers are the most common variety. The present disclosure may be used with either current or voltage mode LVDS drivers and receivers.

Figure 2A:
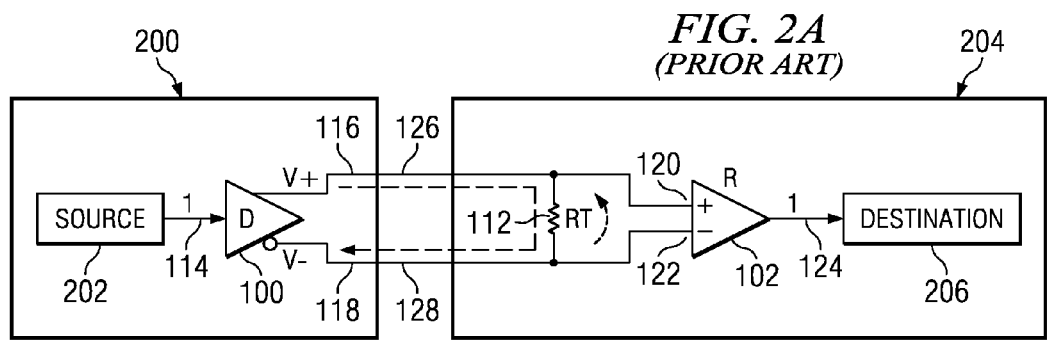
FIG. 2A illustrates a prior art example of a signal source circuit in one device communicating a logic 1 to a signal destination circuit in another device using an LVDS driver and receiver.
Figure 2B:
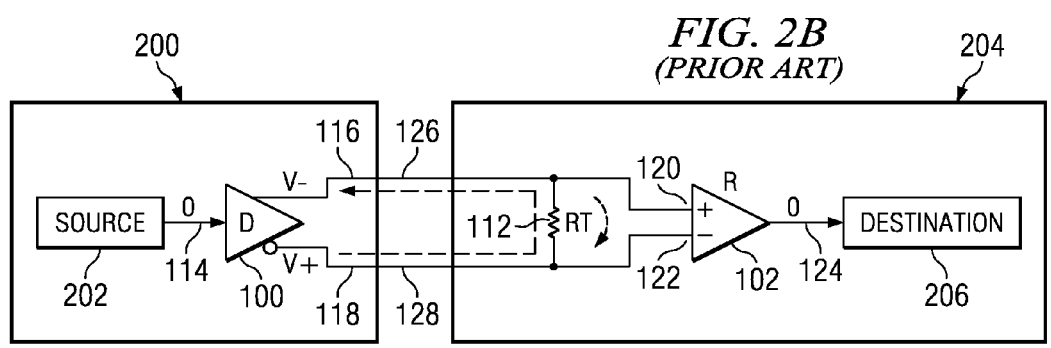
FIG. 2B illustrates a prior art example of a signal source circuit in one device communicating a logic 0 to a signal destination circuit in another device using an LVDS driver and receiver.

FIGS. 2A and 2B illustrate an LVDS connection formed between a first device 200 and a second device 204. Devices 200 and 204 may be sub-systems in a system, boards in a backplane, ICs on a board or other substrate, or embedded core circuits in an IC. In FIGS. 2A and 2B and all following figures, the devices could represent; (1) a master device coupled to a slave device, (2) a master device coupled to another master device, or (3) a slave device coupled to another slave device.

Example master devices include but are not limited too; a microprocessor, a digital signal processor, a Serdes serializer, a computer, a production or field tester, an emulation controller, and a trace/debug controller.

Example slave devices include but are not limited too; a circuit controlled by a microprocessor, a circuit controlled by a digital signal processor, a Serdes deserializer, a circuit controlled by a computer, a circuit controlled by a tester, a circuit controlled by an emulation controller, and a circuit controlled by a trace/debug controller.

Device 200 comprises a signal source 202 and an LDVS driver 100. Device 204 comprises a signal destination 206 and an LDVS receiver 102. The signal source 202 in device 200 may be any type of circuit that operates to output signals to the LVDS driver 100. The signal destination 204 may be any type of circuit in device 204 that operates to input signals from LVDS receiver 102. The source and destination circuits could be used to perform a myriad of operations including but not limited to; (1) a functional operation of the device, (2) a test operation of the device, (3) a debug operation of the device, (4) a trace operation of the device, and (5) an emulation operation of the device.

One example signal source circuit could be a Serdes serializer that operates to input parallel data from another circuit within device 200 and to output the data serially to driver 100. One example signal destination circuit could be a Serdes deserializer that operates to input serial data from receiver 102 and to output the data in parallel to another circuit within device 204.

FIG. 2A illustrates a logic high being output from source 202 and received by destination 206. As seen, the driver 100 outputs current from output terminal 116 to output terminal 118, which develops a voltage across resistor 112 with the polarity being more positive on the receiver input 120 than receiver input 122. The receiver 102 outputs a logic high to destination 206 in response to the polarity of the voltage across the resister 112.

FIG. 2B illustrates a logic low being output from source 202 and received by destination 206. As seen, the driver 100 outputs current from output terminal 118 to output terminal 116, which develops a voltage across resistor 112 with the polarity being more positive on the receiver input 122 than receiver input 120. The receiver 102 outputs a logic low to destination 206 in response to the polarity of the voltage across the resister 112.

In either FIG. 2A or 2B the termination resistor 112 may exist within device 204 or it may exist external of device 204. This is true for all following figures.

Figure 3:
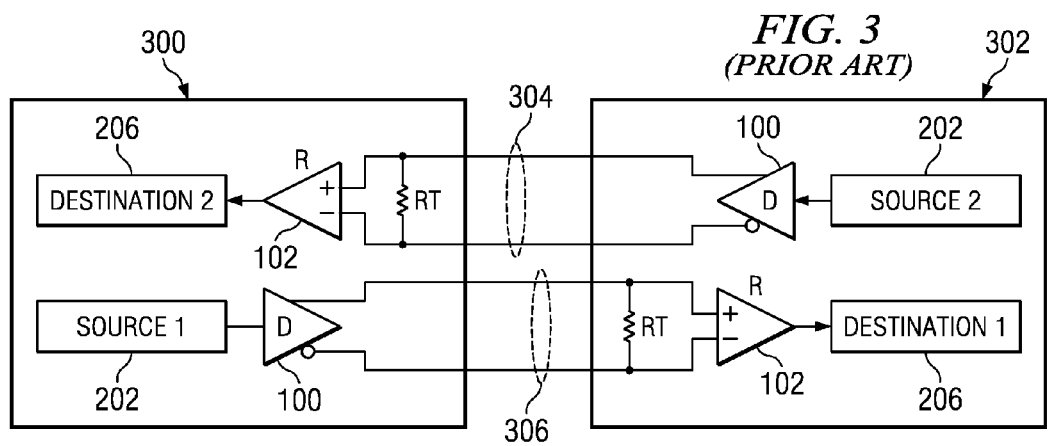
FIG. 3 illustrates prior art example of signal source and destination circuits of one device communicating with signal source and destination circuits of another device using two pairs of LVDS signal paths.

FIG. 3 illustrates two devices 300 and 302 each having signal source 202 and destination 206 circuits and LVDS driver 100 and receiver 102 circuits. In this example, source 1 202 of device 300 can communicate with destination 1 206 of device 302 and source 2 202 of device 302 can communicate with destination 2 206 of device 300. The communications can occur simultaneously since separate LVDS signal paths 304 and 306 exist between the devices. Having to use separate LVDS signal paths for simultaneous communication increases the interconnect between devices 300 and 302.

Figure 4:
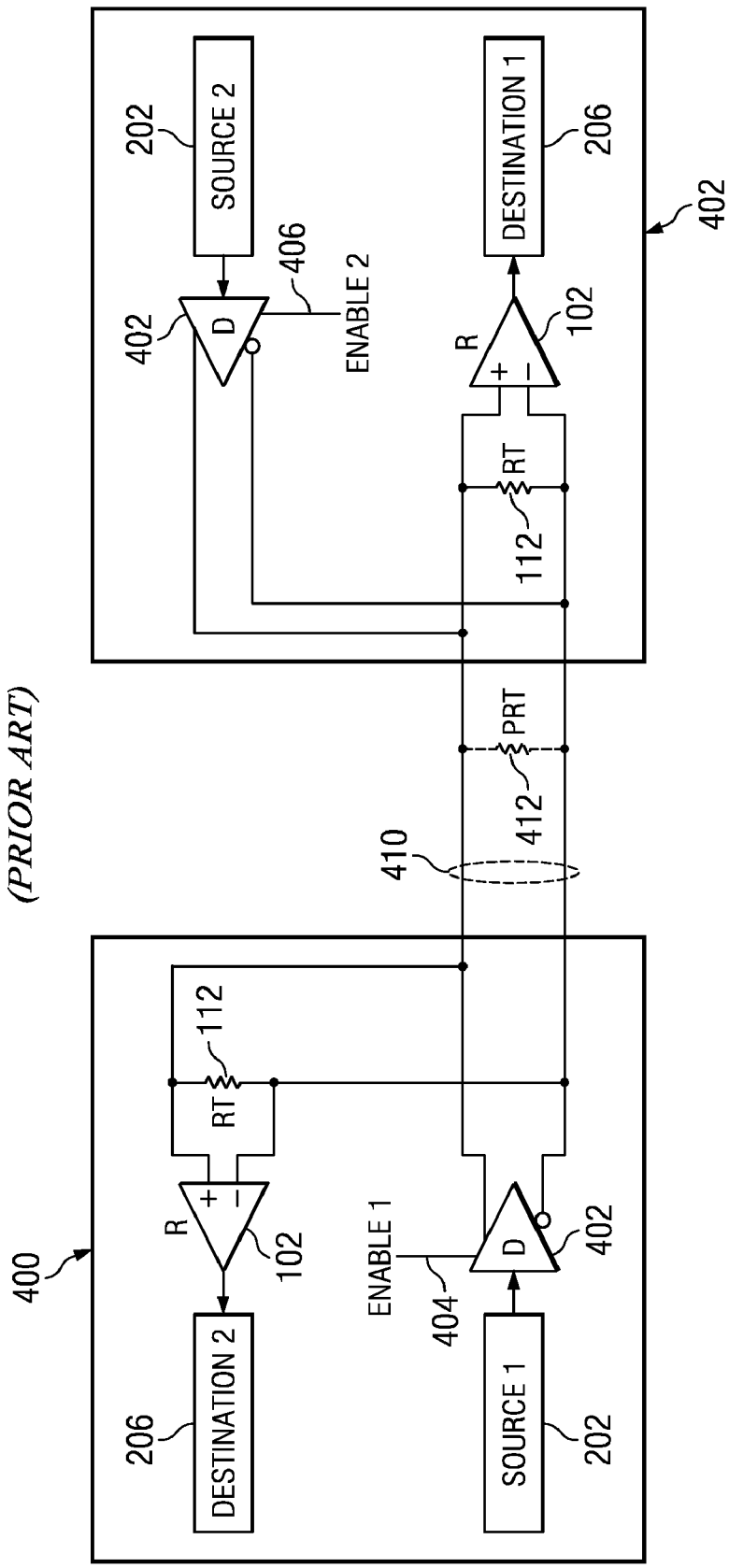
FIG. 4 illustrates prior art example of signal source and destination circuits of one device communicating with signal source and destination circuits of another device using a one pair of LVDS signal paths.

FIG. 4 illustrates two devices 400 and 402 each having signal source 202 and destination 206 circuits and LVDS driver 402 and receiver 102 circuits. LVDS drivers 402 are similar to LVDS drivers 100 with the exception that the LVDS drivers 402 have an enable input 404 and 406. The enable input is used to enable or disable the output drive of driver 402. If enable input 404 is set to enable driver 402 of device 400 and enable input 406 is set to disable driver 402 of device 402, source 1 202 of device 400 can communicate with destination 1 206 of device 402. Likewise, if enable input 404 is set to disable driver 402 of device 400 and enable input 406 is set to enable driver 402 of device 402, source 2 202 of device 402 can communicate with destination 2 206 of device 400. The communications cannot occur simultaneously but rather must occur at separate times since only one LVDS signal path 410 exists between the devices. Having to communicate at separate times decreases the communication bandwidth between the source and destination circuits of devices 400 and 402.

As seen in FIG. 4, the termination resistors 112 of each receiver 102 lie in parallel on the LVDS signal path 410. This results in a parallel resistance termination (PRT) 412 on the signal path (indicated in dotted line). The value of PRT 412 is equal to the parallel resistance of resistors 112. For example, if resistors 112 are 100 ohms, a typical value for LVDS termination resistors, PRT will be 50 ohms. Since current mode LVDS drivers 402 output a constant current, a reduction in the signal path termination resistance (i.e. the 50 ohm PRT) will lower differential signaling voltages on the signal path 410 to the receivers 102. Lowering differential signaling voltages can cause communication problems (i.e. lowers the differential noise margin) between an enabled driver and receiver in the LVDS signaling arrangement of FIG. 4. Therefore the differential signaling arrangement of FIG. 4 should only be used in applications where noise is low and the signaling path 410 is short.

The present disclosure provides a way to allow simultaneous source to destination communication between devices, like in FIG. 3, while requiring only a single LVDS signal path interconnect between devices, like in FIG. 4.

The present disclosure provides a way to maintain appropriate LVDS signaling voltages (and noise margins) on an LVDS signal path where the termination resistance of the signal path is decreased due to the parallel arrangement of LVDS termination resistors, like in FIG. 4.

Figure 5:
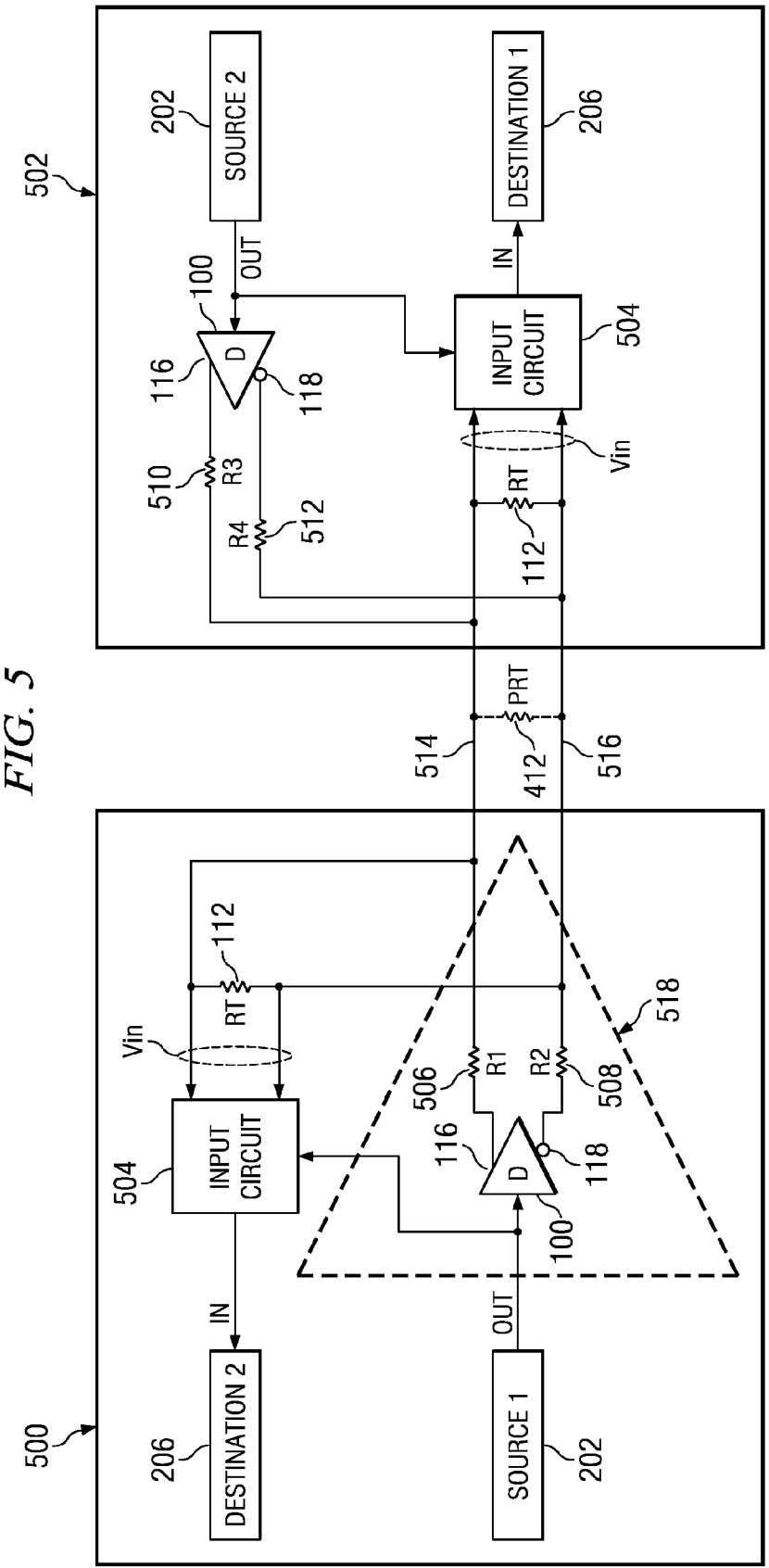
FIG. 5 illustrates signal source and destination circuits of one device communicating with signal source and destination circuits of another device using one pair of LVDS signal paths according to the present disclosure.

FIG. 5 illustrates the LVDS signaling arrangement between devices 500 and 502 according to the present disclosure. Device 500 comprises a signal source 1 202, a signal destination 2 206, an LVDS driver 100, an input circuit 504, termination resistor 112, and resistors 506 and 508. The input circuit 504 receives inputs from LVDS signal path 514, LVDS signal path 516, and the output from source 1 202. The input circuit 514 provides input to destination 2 206. Resistor R1 506 is placed in series between the driver output terminal 116 and signal path 514. Resistor R2 508 is placed in series between the driver output terminal 118 and signal path 516.

Device 502 comprises a signal source 2 202, a signal destination 1 206, an LVDS driver 100, an input circuit 504, termination resistor 112, and resistors 510 and 512. The input circuit 504 receives inputs from LVDS signal path 514, LVDS signal path 516, and the output from source 2 202. The input circuit 514 provides input to destination 1 206. Resistor R3 510 is placed in series between the driver output terminal 116 and signal path 514. Resistor R4 512 is placed in series between the driver output terminal 118 and signal path 516.

If devices 500 and 502 are boards or other substrates in a system, resistors 506-512 could be discrete resistors placed, as shown, in series between the driver outputs 116 and 118 and board/substrate contacts connected to signal paths 514 and 516.

If devices 500 and 502 are ICs on a board or other substrate, resistors 506-512 could be poly or transistor channel resistances placed, as shown, in series between the driver outputs 116 and 118 and IC pads connected to signal paths 514 and 516.

If devices 500 and 502 are embedded core circuits in an IC, resistors 506-512 could be poly or transistor channel resistances placed, as shown, in series between the driver outputs 116 and 118 and core circuit terminals connected to signal paths 514 and 516.

The LVDS driver and series resistor arrangement could be as shown in FIG. 5, i.e. the driver and resistors are separate circuits connected together inside the device, or the driver and series resistors could be integrated to form a new driver circuit 518 applicable for use by the present disclosure. The circuitry and detail operation of the input circuits 504 will be described later in regard to FIGS. 11, 12, and 13.

During operation of the devices in FIG. 5, source 1 202 of device 500 outputs data to driver 100 which transmits differential signals over the signal paths 514-516 to input circuit 504 of device 502 to be input to destination 1 206 of device 502. Simultaneously, source 2 202 of device 502 outputs data to driver 100 which transmits differential signals over the signal paths 514-516 to input circuit 504 of device 500 to be input to destination 2 206 of device 500.

Resistors 506-512 should be equal in value or as near equal in value as possible to each other. The value of each resistor 506-512 is preferably less than the value of the termination resistor 112. In the following description of the examples shown in FIGS. 6A-6B, 7A-7B, 8A-8B, 9A-9B, and 10 it will be assumed for simplification that the termination resistors 112 are 100 ohms, resistors 506-512 are each 25 ohms, and the drivers 100 are 5 milliamp LVDS drivers.

With 100 ohm termination resistors 112, the parallel termination resistance (PRT) 412 across the signal paths 514-516, due to the termination resistors 112, is equal to 50 ohms. While these resistor and current values are used in the description, the present disclosure is not limited to use of only these values. Indeed, other resistance and current values can be used without departing from the spirit and scope of the present disclosure.

In FIG. 6A, it is seen that if source 1 of device 500 and source 2 of device 502 both output a logic high to drivers 100, input circuit 504 of device 500 will input a logic high to destination 2 of device 500 and input circuit 504 of device 502 will input a logic high to destination 1 of device 502.

In FIG. 6B, the electrical model of the FIG. 6A signal transfer operation is shown. As seen, driver 100 of device 500 sources current (I1) into signal path 514 from terminal 116 and returns current (I2) from signal path 516 at terminal 118. Also as seen, driver 100 of device 502 sources current (I3) into signal path 514 from terminal 116 and returns current (I4) from signal path 516 at terminal 118. The sum of the source currents (I1 and I3) pass through PRT 412 (the parallel resistance of terminal resistors 112) and develop a voltage across PRT with the polarity shown. The voltage developed across PRT is input to the voltage input (Vin) of the input circuits 504 of FIG. 6A. In response to Vin the input circuits 504 output logic highs to destinations 1 and 2 206.

In FIG. 6B, if the drivers 100 each provide a source current of 5 milliamps, the voltage across each resistor 506-512 will be 125 millivolts (i.e. 25 ohms×5 ma) and the voltage across PRT 412 will be 500 millivolts (i.e. 50 ohms×10 ma). A Vin of 500 millivolts with the polarity shown provides a differential LVDS input signal to the input circuits 504 that the input circuits 504 can easily recognize as a logic high. The 500 millivolts differential input signal also provides excellent noise immunity in applications with high noise and long signal paths 514-516.

While a 500 millivolts differential signal was produced in this example using the assumed currents and resistances, other differential signal voltages could be produced using different assumptions on currents and resistances.

In FIG. 7A, it is seen that if source 1 of device 500 and source 2 of device 502 both output a logic low to drivers 100, input circuit 504 of device 500 will input a logic low to destination 2 of device 500 and input circuit 504 of device 502 will input a logic low to destination 1 of device 502.

In FIG. 7B, the electrical model of the FIG. 7A signal transfer operation is shown. As seen, driver 100 of device 500 sources current (I2) into signal path 516 from terminal 118 and returns current (I1) from signal path 514 at terminal 116. Also as seen, driver 100 of device 502 sources current (I4) into signal path 516 from terminal 118 and returns current (I3) from signal path 514 at terminal 116. The sum of the source currents (I2 and I4) pass through PRT 412 and develop a voltage across PRT with the polarity shown. The voltage developed across PRT is input to the voltage input (Vin) of the input circuits 504 of FIG. 7A. In response to Vin the input circuits 504 output logic lows to destinations 1 and 2 206.

In FIG. 7B, if the drivers 100 each provide a source current of 5 milliamps, the voltage across each resistor 506-512 will be 125 millivolts (i.e. 25 ohms×5 ma) and the voltage across PRT 412 will be 500 millivolts (i.e. 50 ohms×10 ma). A Vin of 500 millivolts with the polarity shown provides a differential LVDS input signal to the input circuits 504 that the input circuits 504 can easily recognize as a logic low. Again, the 500 millivolts differential input signal provides excellent noise immunity in applications with high noise and long signal paths 514-516.

As in FIGS. 6A-6B, while a 500 millivolts differential signal was produced in the FIG. 7A-7B example using the assumed currents and resistances, other differential signal voltages could be produced using different assumptions on currents and resistances.

In FIG. 8A, it is seen that if source 1 of device 500 outputs a logic high to the driver 100 of device 500 and source 2 of device 502 outputs a logic low to driver 100 of device 502, input circuit 504 of device 500 will input a logic low to destination 2 of device 500 and input circuit 504 of device 502 will input a logic high to destination 1 of device 502.

In FIG. 8B, the electrical model of the FIG. 8A signal transfer operation is shown. As seen, driver 100 of device 500 sources current (I1) into signal path 514 from terminal 116 and returns current (I2) from signal path 516 at terminal 118. Also as seen, driver 100 of device 502 sources current (I4) into signal path 516 from terminal 118 and returns current (I3) from signal path 514 at terminal 116. In this electrical situation, the current (I1) sourced from driver 100 of device 500 is the current (I3) returned to driver 100 of device 502, and the current (I4) sourced from driver 100 of device 502 is the current (I2) returned to driver 100 of device 500.

Since resistors 506-512 are assumed to be 25 ohms each and the source currents I1 and I4 are assumed to be 5 milliamps each, the voltages present on signal path 514 and signal path 516 are the same or very close to being the same. With the same voltage present on the terminals of PRT 412, no current, or only a small leakage current, flows through PRT 412. Thus the voltage drop across PRT (i.e. Vin) that is input to input circuits 504 is extremely small.

In response to the small Vin voltage, the input circuits 504 of devices 500 and 502 are designed to input the opposite logic level that each device 500 and 502 was outputting. For example, since source 1 202 of device 500 in FIG. 8A is outputting a logic high, the input circuit 504 of device 500 will respond to the small Vin voltage by inputting a logic low to destination 2 206 of device 500. Likewise, since source 2 202 of device 502 in FIG. 8A is outputting a logic low, the input circuit 504 of device 502 will respond to the small Vin voltage by inputting a logic high to destination 1 206 of device 502.

In FIG. 9A, it is seen that if source 1 of device 500 outputs a logic low to the driver 100 of device 500 and source 2 of device 502 outputs a logic high to driver 100 of device 502, input circuit 504 of device 500 will input a logic high to destination 2 of device 500 and input circuit 504 of device 502 will input a logic low to destination 1 of device 502.

In FIG. 9B, the electrical model of the FIG. 9A signal transfer operation is shown. As seen, driver 100 of device 500 sources current (I2) into signal path 516 from terminal 118 and returns current (I1) from signal path 514 at terminal 116. Also as seen, driver 100 of device 502 sources current (I3) into signal path 514 from terminal 116 and returns current (I4) from signal path 516 at terminal 118. In this electrical situation, the current (I2) sourced from driver 100 of device 500 is the current (I4) returned to driver 100 of device 502, and the current (I3) sourced from driver 100 of device 502 is the current (I1) returned to driver 100 of device 500.

Since resistors 506-512 are assumed to be 25 ohms each and the source currents I2 and I3 are assumed to be 5 milliamps each, the voltages present on signal path 514 and signal path 516 are the same or very close to being the same. With the same voltage present on the terminals of PRT 412, no current, or only a small leakage current, flows through PRT 412. Thus the voltage drop across PRT (i.e. Vin) that is input to input circuits 504 is extremely small.

In response to the small Vin voltage, the input circuits 504 of devices 500 and 502 are designed to input the opposite logic level that each device 500 and 502 was outputting. For example, since source 1 202 of device 500 in FIG. 9A is outputting a logic low, the input circuit 504 of device 500 will respond to the small Vin voltage by inputting a logic high to destination 2 206 of device 500. Likewise, since source 2 202 of device 502 in FIG. 9A is outputting a logic high, the input circuit 504 of device 502 will respond to the small Vin voltage by inputting a logic low to destination 1 206 of device 502.

Figure 10:
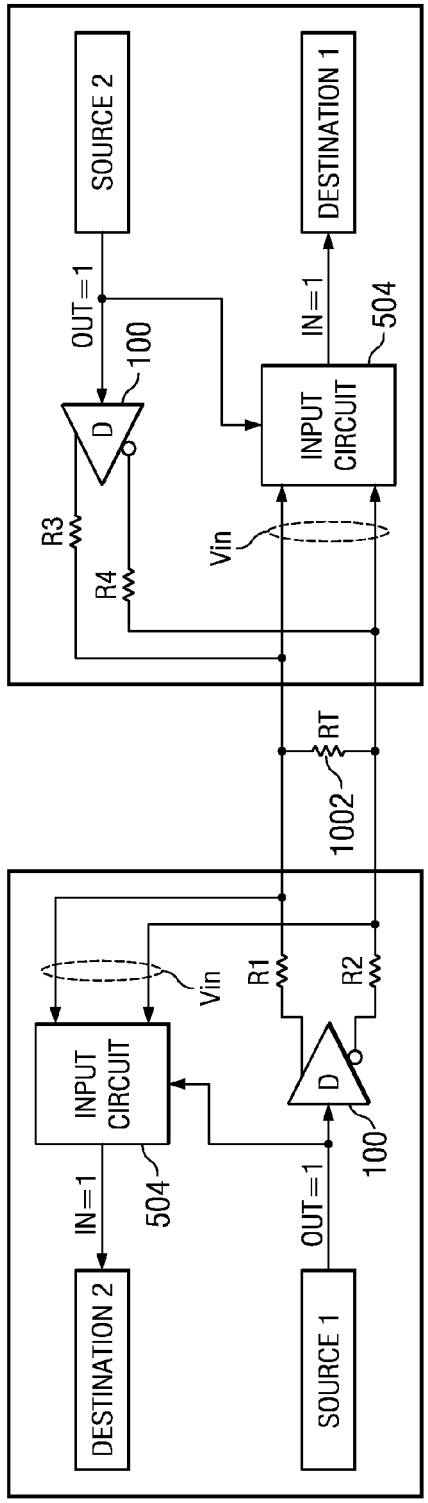
FIG. 10 illustrates use of a single termination resistor in the LVDS signal paths of the present disclosure.

FIG. 10 is provided to indicate that in applications where noise is low and the signal paths are short, a single termination resistor (RT) 1002 may be used between the signal paths instead of the two separate termination resistors 112 previously shown on the input of the input circuits 504. It is clear that use of a single termination resistor 1002, of say 100 ohms, will advantageously increase the Vin voltage to the input circuits 504 using the assumed 5 milliamp LVDS drivers 100. The operation of the present disclosure in the single termination resistor arrangement of FIG. 10 is identical to that previously described in FIGS. 6A-6B through 9A-9B.

As seen from the above descriptions of FIGS. 6A-6B, 7A-7B, 8A-8B, 9A-9B, and 10, the present disclosure uses a network of resistances (R1, R2, R3, R4, and PRT/RT) in an LVDS signal path 514-516 in combination with special input circuits 504 to advantageously enable simultaneous differential signal communication between two devices.

Figure 11B:
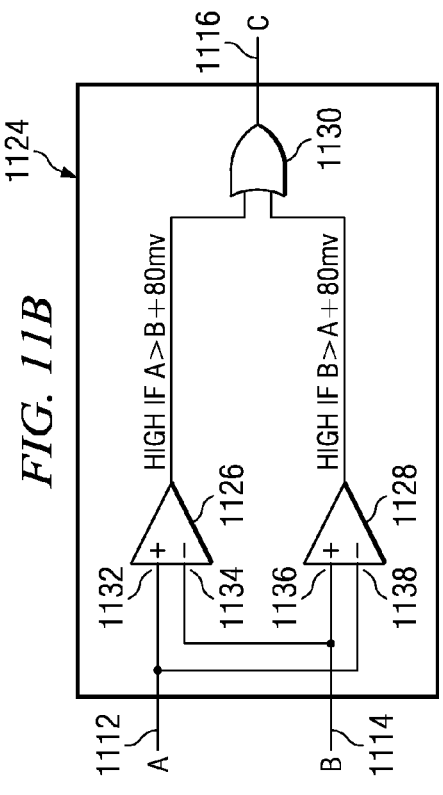
FIG. 11B illustrates one example of how the window comparator of the input circuit of FIG. 11A may be designed.
Figure 11A:
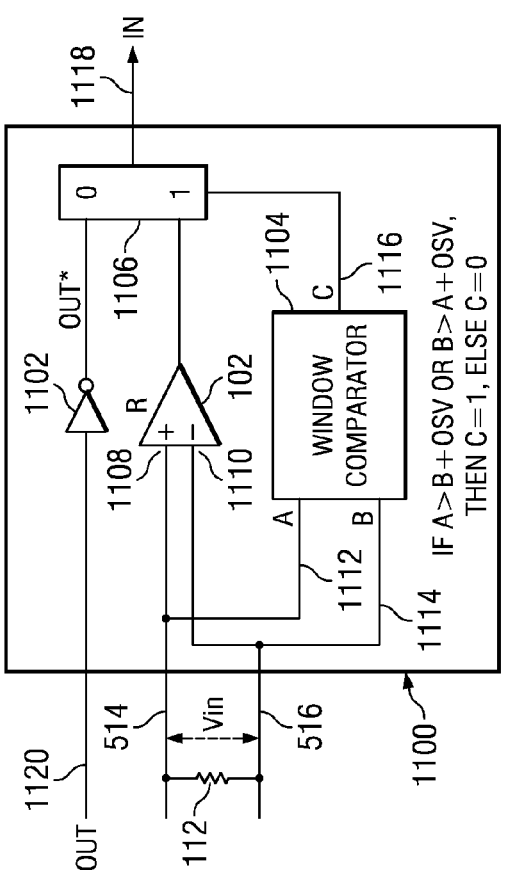
FIG. 11A illustrates a first example of how the input circuit of the present disclosure may be designed.

FIG. 11A illustrates a first example circuit 1100 that could be used to perform the function of input circuit 504. Circuit 1100 comprises an inverter 1102 with its input coupled to the output 1120 from source circuit 202, a differential receiver 102 with its non-inverting input 1108 coupled to signal path 514 and its inverting input 1110 coupled to signal path 516, a window comparator 1104 with its A input 1112 coupled to signal path 514 and its B input 1114 coupled to signal path 516, and a multiplexer 1106 with a first input coupled to the output of inverter 1102, a second input coupled to the output of differential receiver 102, a control input coupled to the output window comparator 1104, and an output 1118 coupled to the input to destination circuit 206.

The function of the window comparator 1104 is to output a logic high on the C output 1116 whenever the voltage on its A input 1112 is greater than the voltage on its B input 1114 plus an offset voltage (OSV) "or" whenever the voltage on its B input 1114 is greater than the voltage on its A input 1112 plus an offset voltage (OSV). Otherwise the window comparator outputs a logic low on the C output 1116.

The offset voltages (OSV) are set such that if a small differential voltage, as described in FIGS. 8A-8B and 9A-9B, is present between signal paths 514 and 516, the voltage differential at the A and B inputs of the window comparator 1104 will not be sufficiently large enough to cause the C output of the window comparator to be set to a logic high. Thus in response to small differential voltages, the window comparator 1104 will output a logic low to the control input of multiplexer 1106, which causes the inverted Out (Out*) signal from the source 202 of a device to be input to the destination 206 of the same device, via multiplexer output 1118.

On the other hand, if an adequately large differential voltage is present between the signal paths 514 and 516, the differential voltage at the A and B inputs of the window comparator 1104 will be sufficiently large enough to exceed the offset voltages (OSV) and cause the C output of the window comparator to be set to a logic high. For example, the 500 mv signal of polarity shown in FIGS. 6A-6B will cause output C of the window comparator to be set high. Likewise, the 500 mv signal of polarity shown in FIG. 7A-7B will cause output C of the window comparator to be set high. If output C of the window comparator is high, multiplexer 1106 will output the output of receiver 102 to the destination 206 via multiplexer output 1118. For example, receiver 102 will output a logic high to destination 206, via multiplexer 1106, in response to receiving the 500 mv signal of polarity shown in FIGS. 6A-6B. Further, receiver 102 will output a logic low to destination 206, via multiplexer 1106, in response to receiving the 500 mv signal of polarity shown in FIGS. 7A-7B.

In summary, the input circuit 1100 of FIG. 11A outputs the inverted output of the source 202 of a device to the destination 206 of the same device if the differential voltage on signal paths 514 and 516 is small and within a voltage window established by offset voltage (OSV) settings. The input circuit 1100 of FIG. 11A outputs the output of the receiver 102 to the destination 206 of the device if the differential voltage on signal paths 514 and 516 is large and outside the voltage window established by the offset voltage (OSV) settings.

FIG. 11B illustrates one example circuit 1124 that could be used as window comparator 1104 of FIG. 11B. The circuit 1124 comprises a first comparator 1126 with its non-inverting input 1132 coupled to input A 1112 and its inverting input 1134 coupled to input B 1114, a second comparator 1128 with its non-inverting input 1136 coupled to input B 1114 and its inverting input 1138 coupled to input A 1112, an OR gate 1130 with a first input coupled to the output of comparator 1126, a second input coupled to the output of comparator 1128, and an output coupled to output C 1116.

Comparator 1126 is designed such that the voltage on its non-inverting input 1132 must be greater than the voltage on its inverting input 1134 by an offset voltage (OSV) value (assumed to be 80 millivolts in this example) before the comparator output will go high. Comparator 1128 is designed such that the voltage on its non-inverting input 1136 must be greater than the voltage on its inverting input 1138 by an offset voltage (OSV) value (assumed to be 80 millivolts in this example) before the comparator output will go high. If the voltage difference on the A and B inputs is less than 80 millivolts, output C goes low. If the voltage difference on the A and B inputs is greater than 80 millivolts, output C goes high. While 80 millivolts was used as an example OSV, any desired value of OSV may be used as well.

Figure 12A:
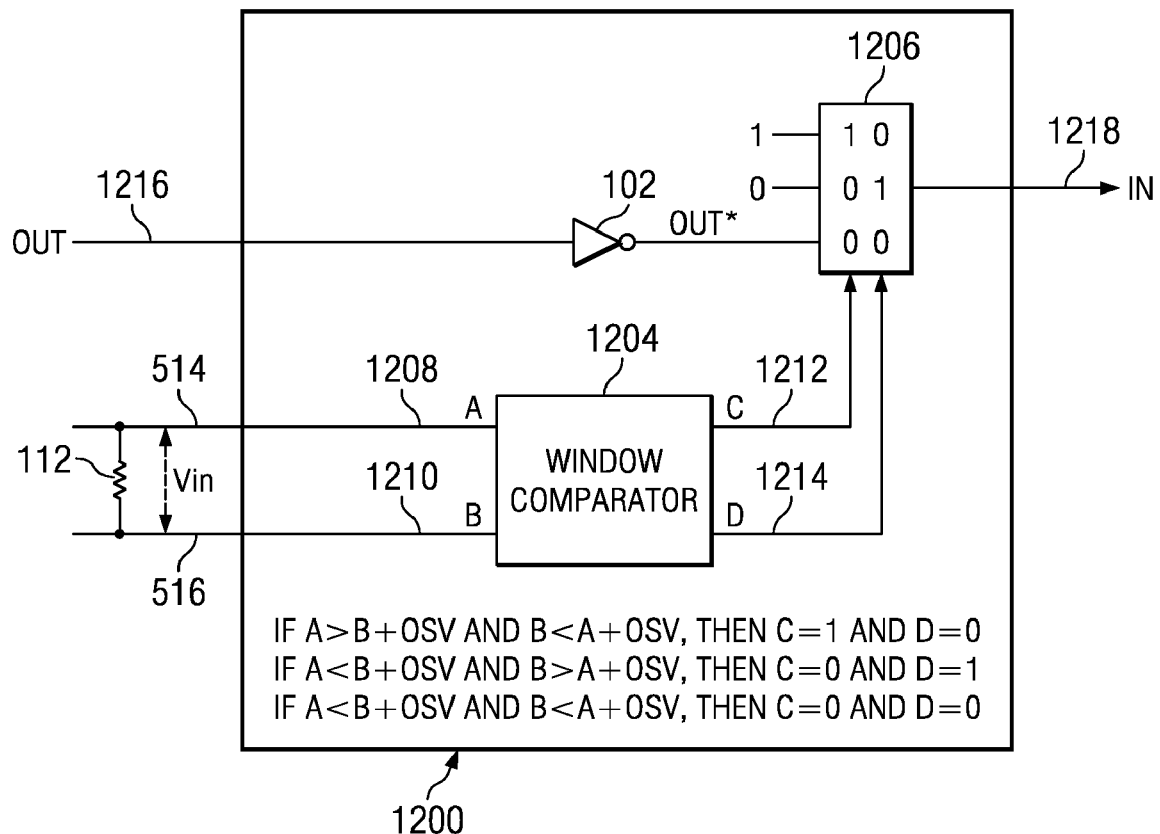
FIG. 12A illustrates a second example of how the input circuit of the present disclosure may be designed.

FIG. 12A illustrates a second example circuit 1200 that could be used to perform the function of input circuit 504. Circuit 1200 comprises an inverter 1202 with its input coupled to the output 1216 from source circuit 202, a window comparator 1204 with its A input 1208 coupled to signal path 514 and its B input 1210 coupled to signal path 516, and a multiplexer 1206 with a first input coupled to a fixed logic high, a second input coupled to a fixed logic low, a third input coupled to the output of inverter 1202, a first control input coupled to output C 1212 of window comparator 1204, a second control input coupled to output D 1214 of window comparator 1204, and an output 1218 coupled to the input to destination circuit 206.

The functions of the window comparator 1204 are:
(1) to output a logic high on output C and a logic low on output D whenever the voltage on its A input 1208 is greater than the voltage on its B input 1210 plus an offset voltage (OSV) "and" the voltage on its B input 1210 is less than the voltage on its A input plus an offset voltage (OSV),
(2) to output a logic low on output C and a logic high on output D whenever the voltage on its A input 1208 is less than the voltage on its B input 1210 plus an offset voltage (OSV) "and" the voltage on its B input 1210 is greater than the voltage on its A input plus an offset voltage (OSV),
(3) to output a logic low on output C and output D whenever the voltage on its A input 1208 is less than the voltage on its B input 1210 plus an offset voltage (OSV) "and" the voltage on its B input 1210 is less than the voltage on its A input plus an offset voltage (OSV).

The offset voltages (OSV) are set such that if a small differential voltage, as described in FIGS. 8A-8B and 9A-9B, is present between signal paths 514 and 516, the voltage differential at the A and B inputs of the window comparator 1204 will not be sufficiently large enough to cause both the C and D outputs of the window comparator to be set high. Thus in response to small differential voltages, the window comparator 1204 will output logic lows to the control inputs of multiplexer 1206, which causes the inverted Out (Out*) signal from the source 202 of a device to be input to the destination 206 of the same device, via multiplexer output 1206.

On the other hand, if an adequately large differential voltage is present between the signal paths 514 and 516, the differential voltage at the A and B inputs of the window comparator 1104 will be sufficiently large enough to exceed the offset voltages (OSV) and cause either the C or D output of the window comparator to be set high. For example, the 500 mv signal of polarity shown in FIGS. 6A-6B will cause output C to be set high and output D to be set low. Likewise, the 500 mv signal of polarity shown in FIG. 7A-7B will cause output D to be set high and output C to be set low.

If output C is high and output D is low, multiplexer 1206 will output the fixed logic high input to destination 206 via multiplexer output 1218. If output C is low and output D is high, multiplexer 1206 will output the fixed logic low input to destination 206. And as mentioned, if both output C and D are low, multiplexer 1206 will output the inverted output (Out*) of the source 202 of a device to the destination 206 of the same device.

In summary, the input circuit 1200 of FIG. 12A outputs the inverted output of the source 202 of a device to the destination 206 of the same device if the differential voltage on signal paths 514 and 516 is small and within a voltage window established by offset voltage (OSV) settings. The input circuit 1200 of FIG. 12A outputs the fixed logic high to the destination 206 of the device if the differential voltage on signal paths 514 and 516 is such that the voltage on input A is sufficiently larger that the voltage on input B plus the offset voltage (OSV). The input circuit 1200 of FIG. 12A outputs the fixed logic low to the destination 206 of the device if the differential voltage on signal paths 514 and 516 is such that the voltage on input B is sufficiently larger that the voltage on input A plus the offset voltage (OSV).

Figure 12B:
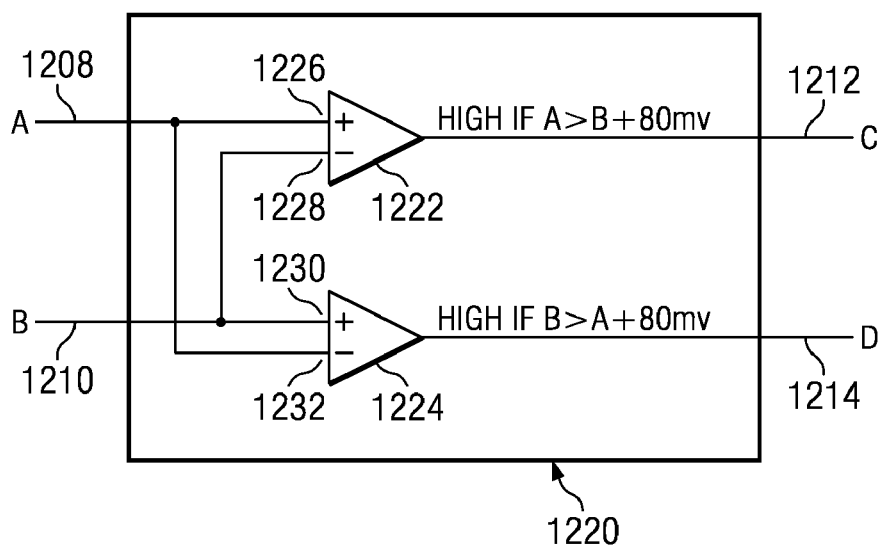
FIG. 12B illustrates one example of how the window comparator of the input circuit of FIG. 12A may be designed.

FIG. 12B illustrates one example circuit 1220 that could be used as window comparator 1204 of FIG. 12B. The circuit 1220 comprises a first comparator 1222 with its non-inverting input 1226 coupled to input A 1208, its inverting input 1228 coupled to input B 1210, and its output coupled to output C 1212, and a second comparator 1224 with its non-inverting input 1230 coupled to input B 1210, its inverting input 1232 coupled to input A 1208, and its output coupled to output D 1214.

Comparator 1222 is designed such that the voltage on its non-inverting input 1226 must be greater than the voltage on its inverting input 1228 by an offset voltage (OSV) value (80 millivolts in this example) before the comparator output C will go high. Comparator 1224 is designed such that the voltage on its non-inverting input 1230 must be greater than the voltage on its inverting input 1232 by an offset voltage (OSV) value (80 millivolts in this example) before the comparator output D will go high. If the voltage difference on the A and B inputs is less than 80 millivolts, comparator outputs C and D go low. While 80 millivolts was used as an example OSV, any desired value of OSV may be used as well.

FIGS. 13A-13D show another circuit 1300 that could be used to realize window comparator 1104 of FIG. 11A. Circuit 1300 comprises a first comparator 1302 with its non-inverting input coupled to the A input and its inverting input coupled to a reference voltage (assumed to be 250 mv in the FIG. 13A-13D examples), a second comparator 1304 with its non-inverting input coupled to the B input and its inverting input coupled to the reference voltage, an OR gate 1306 with a first input coupled to the output of comparator 1302, a second input coupled to the output of comparator 1304, and an output coupled to the C output. To simply the description, circuit 1300 will be shown used in the signaling arrangements previously described in FIGS. 6B, 7B, 8B, and 9B, and with the previously assumed resistance and current values stated for said Figures.

Figure 13A:
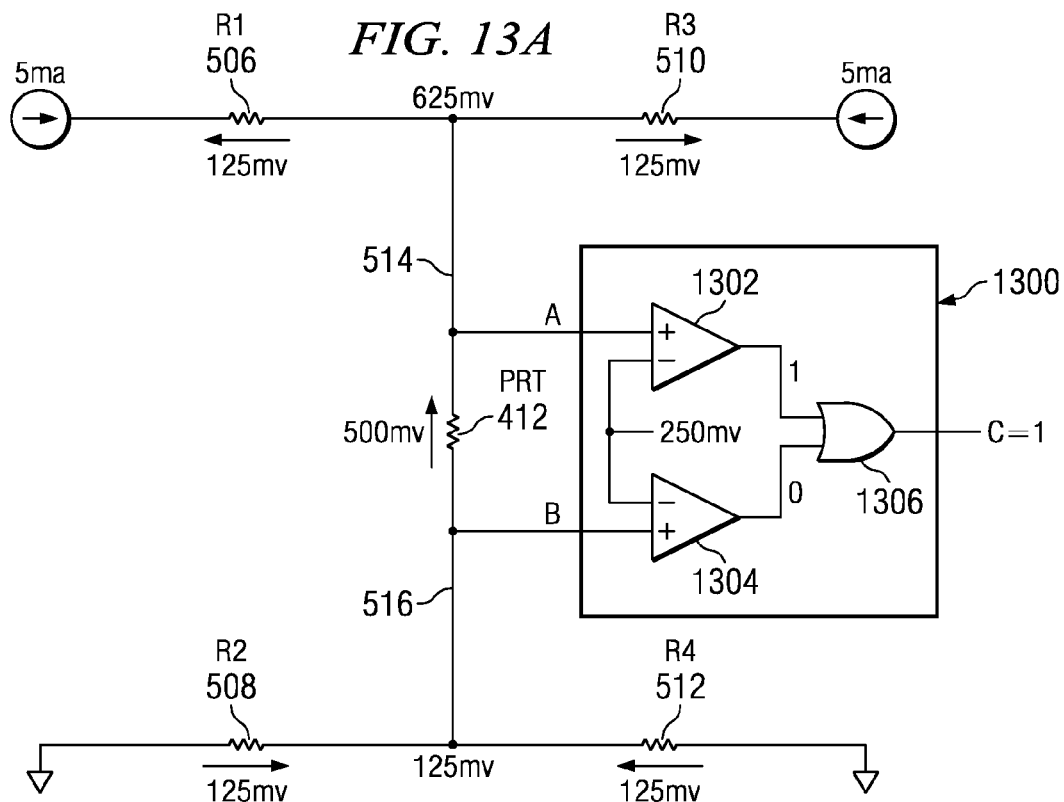
FIGS. 13A-13D illustrate a second example of how the window comparator of FIG. 11A may be designed.

FIG. 13A illustrates that in the previously described signaling arrangement of FIG. 6B, the voltage (625 mv) on the A input of circuit 1300, coupled to signal path 514, will be greater than the reference voltage (250 mv) and the voltage (125 mv) on the B input, coupled to signal path 516, will be less than the reference voltage (250 mv). Thus comparator 1302 will output a logic high to OR gate 1306 and comparator 1304 will output a logic low to OR gate 1306. In response, the OR gate will output a logic high on the output C, causing multiplexer 1106 of FIG. 11A to output the output of receiver 102 to destination 206 as previously described.

Figure 13B:
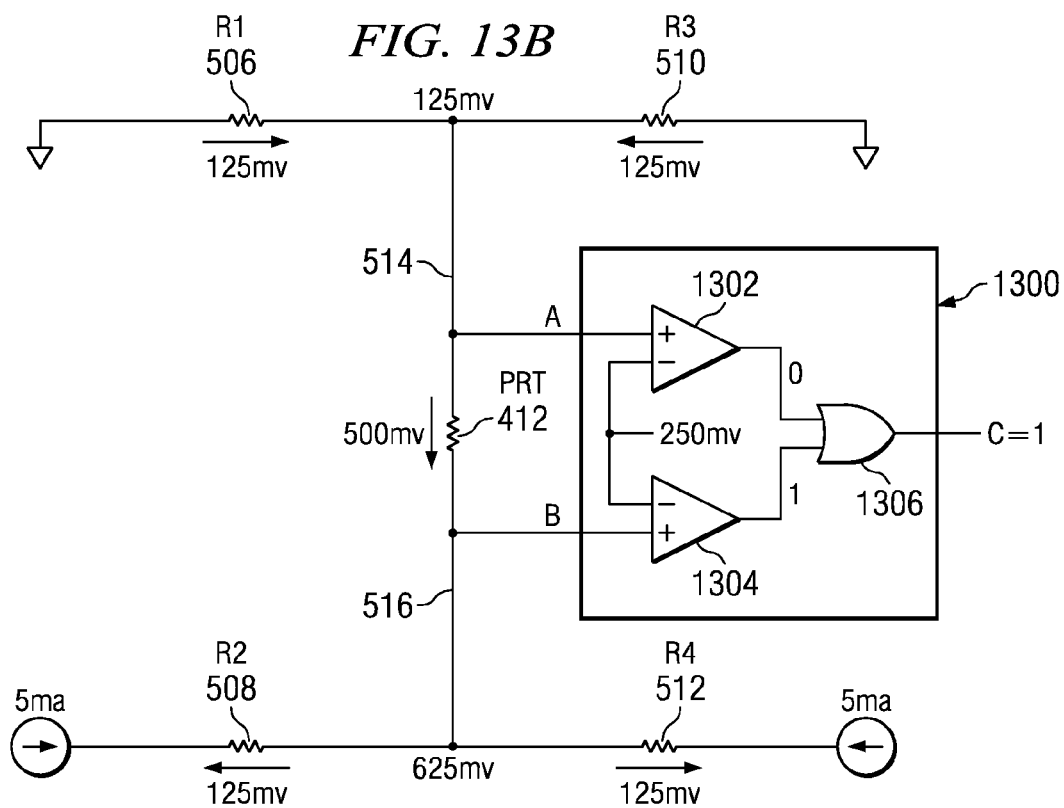

FIG. 13B illustrates that in the previously described signaling arrangement of FIG. 7B, the voltage (125 mv) on the A input of circuit 1300, coupled to signal path 514, will be less than the reference voltage (250 mv) and the voltage (625 mv) on the B input, coupled to signal path 516, will be greater than the reference voltage (250 mv). Thus comparator 1302 will output a logic low to OR gate 1306 and comparator 1304 will output a logic high to OR gate 1306. In response, the OR gate will output a logic high on the output C, causing multiplexer 1106 of FIG. 11A to output the output of receiver 102 to destination 206 as previously described.

Figure 13C:
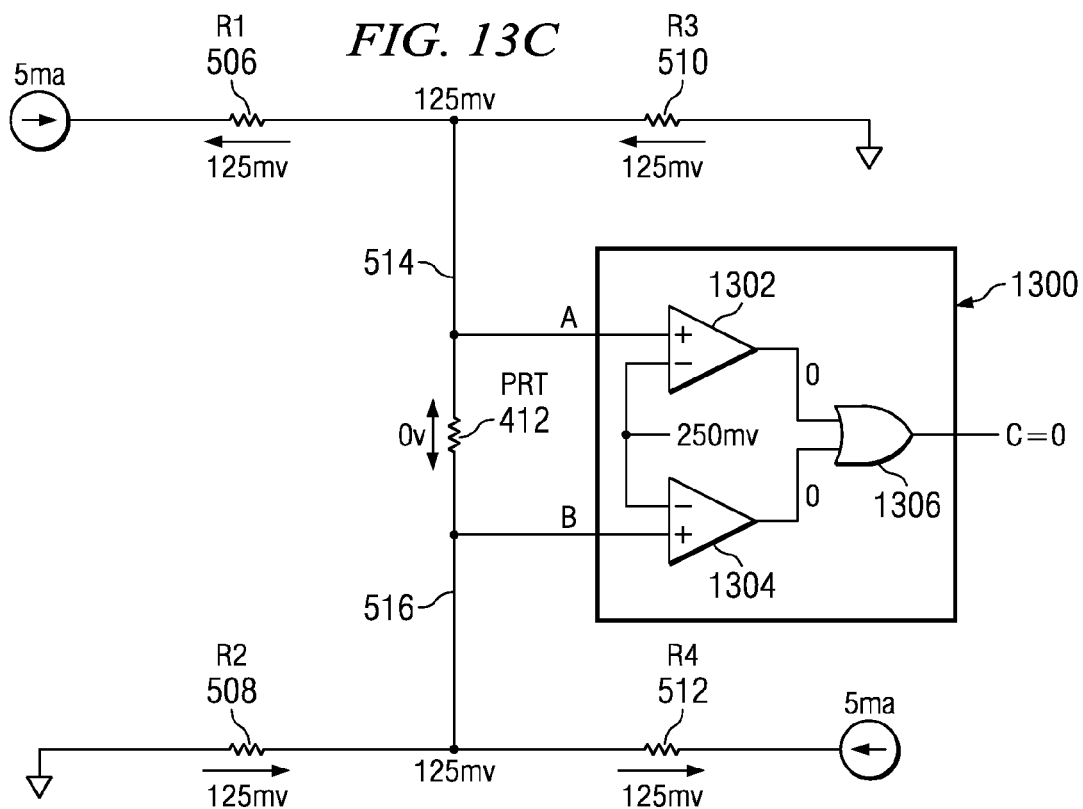

FIG. 13C illustrates that in the previously described signaling arrangement of FIG. 8B, the voltage (125 mv) on the A input of circuit 1300, coupled to signal path 514, will be less than the reference voltage (250 mv) and the voltage (125 mv) on the B input, coupled to signal path 516, will be less than the reference voltage (250 mv). Thus comparator 1302 will output a logic low to OR gate 1306 and comparator 1304 will output a logic low to OR gate 1306. In response, the OR gate will output a logic low on the output C, causing multiplexer 1106 of FIG. 11A to output the output (Out*) of inverter 1102 to destination 206 as previously described.

Figure 13D:
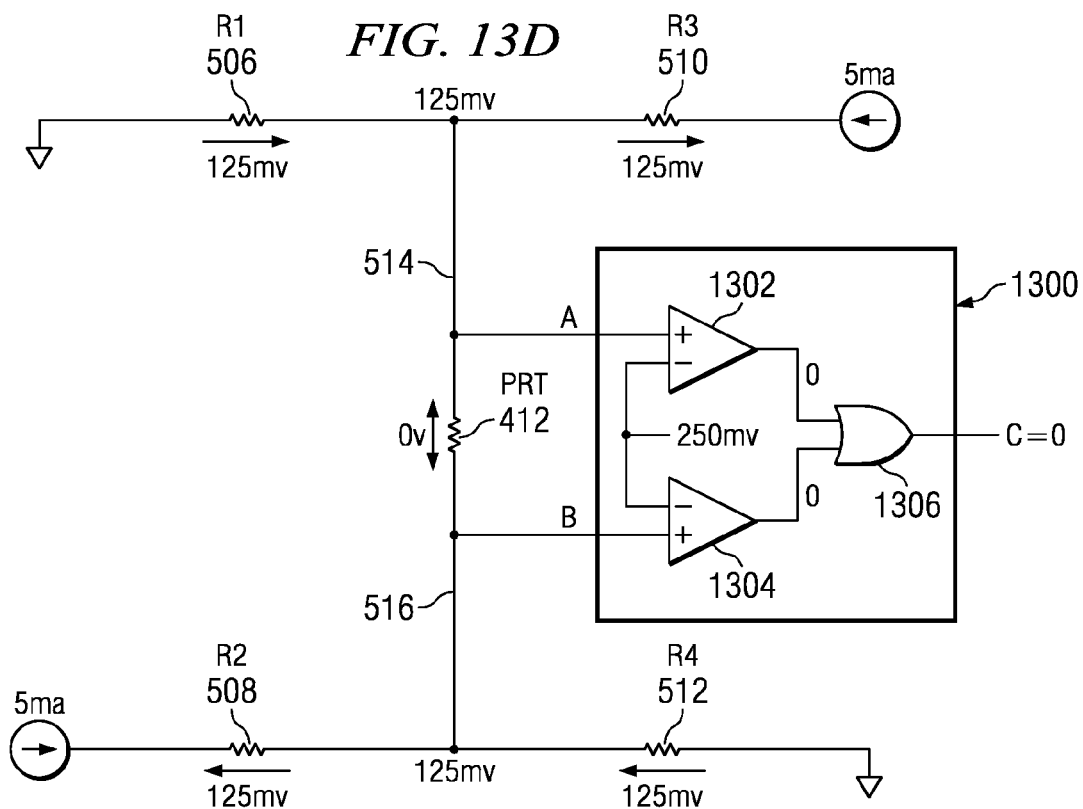

FIG. 13D illustrates that in the previously described signaling arrangement of FIG. 9B, the voltage (125 mv) on the A input of circuit 1300, coupled to signal path 514, will be less than the reference voltage (250 mv) and voltage (125 mv) on the B input, coupled to signal path 516, will be less than the reference voltage (250 mv). Thus comparator 1302 will output a logic low to OR gate 1306 and comparator 1304 will output a logic low to OR gate 1306. In response, the OR gate will output a logic low on the output C, causing multiplexer 1106 of FIG. 11A to output the output (Out*) of inverter 1102 to destination 206 as previously described.

FIGS. 13E-13H depicts another circuit 1308 that could be used to realize window comparator 1204 of FIG. 12A. Circuit 1308 comprises a first comparator 1310 with its non-inverting input coupled to the A input, its inverting input coupled to a reference voltage (assumed to be 250 mv in the FIG. 13E-13H examples), and an output coupled to the C output, a second comparator 1312 with its non-inverting input coupled to the B input, its inverting input coupled to the reference voltage, and an output coupled to the D output. To simply the description, circuit 1308 will be shown used in the signaling arrangements previously described in FIGS. 6B, 7B, 8B, and 9B, and with the previously assumed resistance and current values stated for said Figures.

Figure 13E:
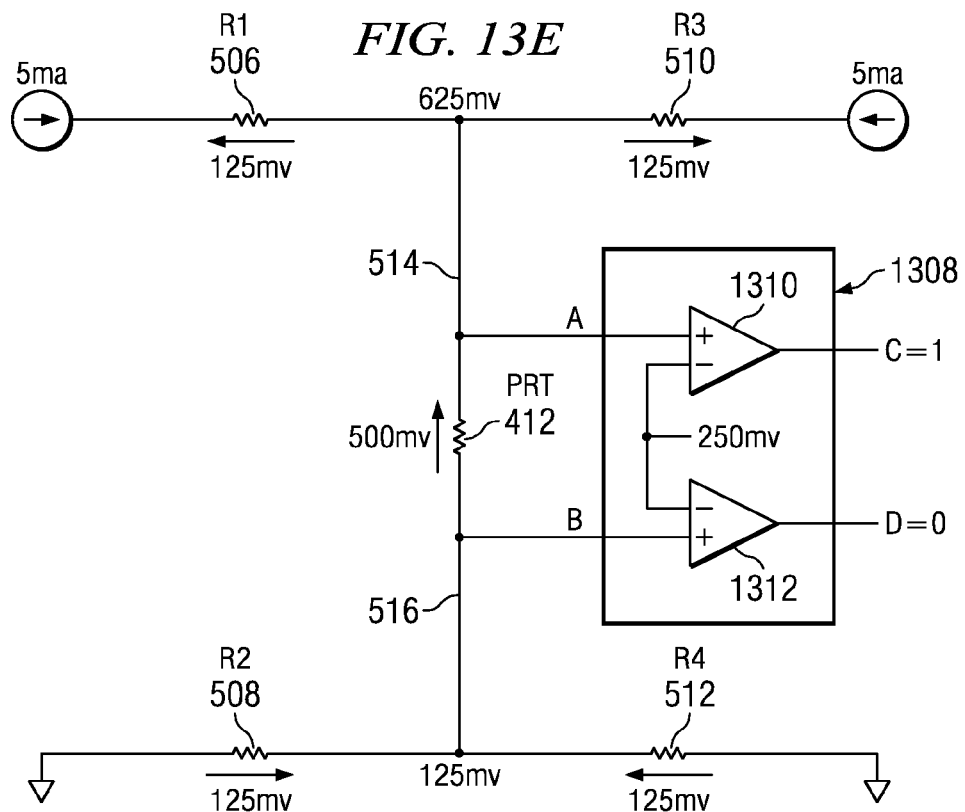

FIG. 13E illustrates that in the previously described signaling arrangement of FIG. 6B, the voltage (625 mv) on the A input of circuit 1308, coupled to signal path 514, will be greater than the reference voltage (250 mv) and the voltage (125 mv) the on B input, coupled to signal path 516, will be less than the reference voltage (250 mv). Thus comparator 1310 will output a logic high on the C output and comparator 1312 will output a logic low on the D output. In response to C being high and D being low, multiplexer 1206 of FIG. 12A will output the fixed logic high input to destination 206 as previously described.

Figure 13F:
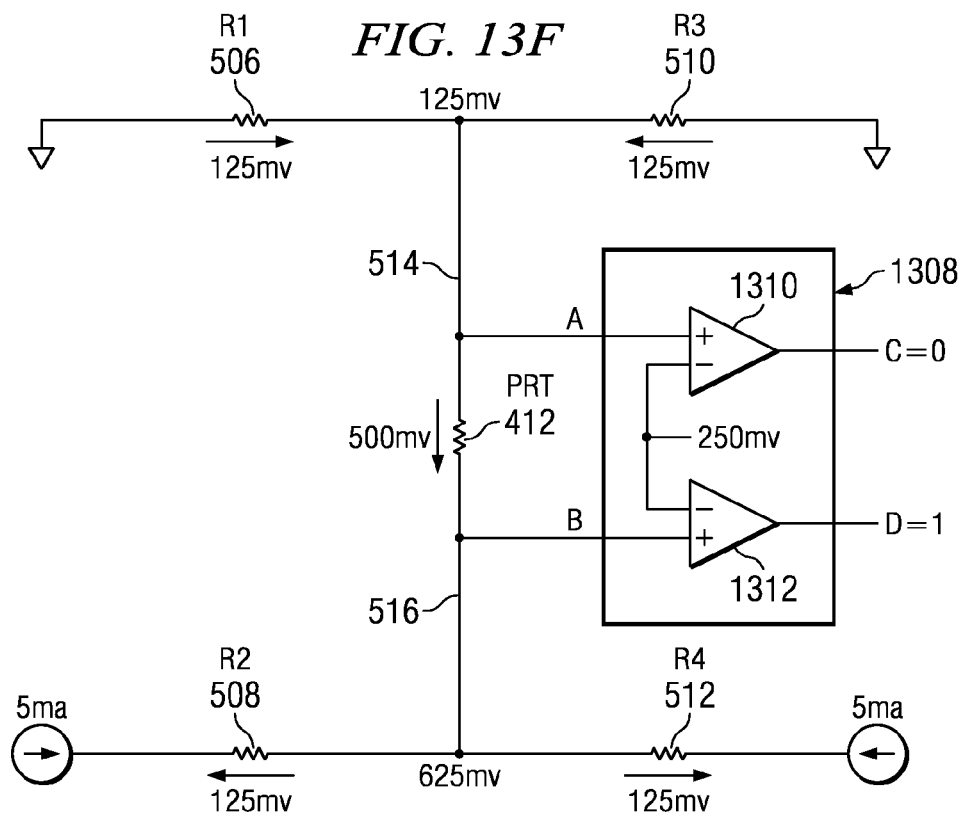

FIG. 13F illustrates that in the previously described signaling arrangement of FIG. 7B, the voltage (125 mv) on the A input of circuit 1308, coupled to signal path 514, will be less than the reference voltage (250 mv) and the voltage (625 mv) the on B input, coupled to signal path 516, will be greater than the reference voltage (250 mv). Thus comparator 1310 will output a logic low on the C output and comparator 1312 will output a logic high on the D output. In response to C being low and D being high, multiplexer 1206 of FIG. 12A will output the fixed logic low input to destination 206 as previously described.

FIG. 13G illustrates that in the previously described signaling arrangement of FIG. 8B, the voltage (125 mv) on the A input of circuit 1308, coupled to signal path 514, will be less than the reference voltage (250 mv) and the voltage (125 mv) the on B input, coupled to signal path 516, will be less than the reference voltage (250 mv). Thus comparator 1310 will output a logic low on the C output and comparator 1312 will output a logic low on the D output. In response to C being low and D being low, multiplexer 1206 of FIG. 12A will output the output (Out*) of inverter 1202 to destination 206 as previously described.

FIG. 13H illustrates that in the previously described signaling arrangement of FIG. 9B, the voltage (125 mv) on the A input of circuit 1308, coupled to signal path 514, will be less than the reference voltage (250 mv) and the voltage (125 mv) the on B input, coupled to signal path 516, will be less than the reference voltage (250 mv). Thus comparator 1310 will output a logic low on the C output and comparator 1312 will output a logic low on the D output. In response to C being low and D being low, multiplexer 1206 of FIG. 12A will output the output (Out*) of inverter 1202 to destination 206 as previously described.

While FIGS. 11A-11B, 12A-12B, and 13A-G have shown various examples of how to design input circuits 504 for use by the present disclosure, it is anticipated that other ways of designing input circuits 504 will be conceived by those skilled in the art. Thus the present disclosure is not limited to only using the example input circuit designs shown and described herein.

Figure 14:
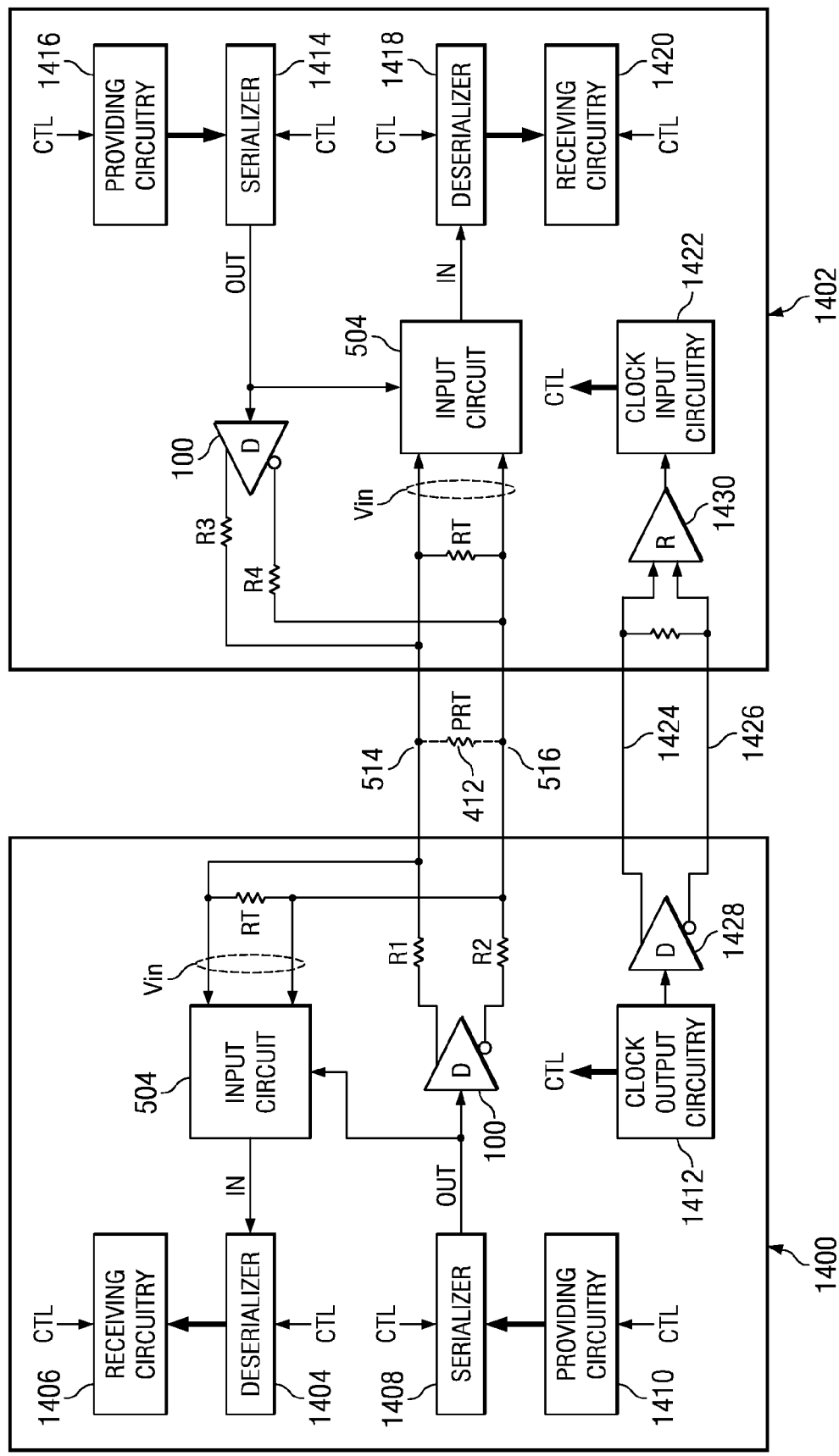
FIG. 14 illustrates an example of two devices connected together via an LVDS data signal path and an LVDS clock signal path according to the present disclosure.

FIG. 14 illustrates two devices 1400 and 1402 coupled together using an LVDS signal path 514-516 for transferring data signals and an LVDS signal path 1424-1426 for transferring clock signals. The devices communicate data simultaneously between each other using input circuit 504, driver 100, and signaling path resistor network as previously described. The data being communicated could be of any data type, including but not limited to; functional data, test data, debug data, trace data, and emulation data Device 1400 comprises a deserializer 1404 for inputting serial data from input circuit 504, data receiving circuitry 1406 for inputting parallel data from the deserializer 1404, a serializer 1408 for inputting serial data to driver 100, and data providing circuitry 1410 for inputting parallel data to serializer 1408. The combination of the data receiving circuitry 1406 and deserializer 1404 represent one example design for a destination circuit 206. The combination of the data providing circuitry 1410 and serializer 1408 represent one example design for a source circuit 202. Device 1400 also comprises clock output circuitry 1412 and an LVDS clock driver 1428. The clock output circuitry 1412 provides a clock output to driver 1428 and outputs control (CTL) signals to operate the providing circuitry 1410, serializer 1408, deserializer 1404, and receiving circuitry 1406. The control (CTL) signals output to the serializer and deserializer from the clock output circuit will operate faster than the control signals to the receiving and providing circuits since they will be controlling the higher speed serial input and output operations occurring over signal paths 514 and 516. The clock output circuit 1412 may employ use of clock and control signal modification circuits such as but not limited to; a phase lock loop, a phase shifter, a frequency divider, or a frequency multiplier. Driver 1428 is similar to driver 100 and drives LVDS clock outputs from device 1400 on signal paths 1424 and 1426. LVDS clocking is shown being used to provide high speed clock signals from device 1400 to device 1402. If desired, single ended clocking could be used instead of the differential clocking shown, but the clocking frequency would be reduced between device 1400 and 1402. Device 1400 is assumed to be a master device since it outputs the LVDS clock on signal paths 1424-1426.

Device 1402 comprises a deserializer 1418 for inputting serial data from input circuit 504, data receiving circuitry 1420 for inputting parallel data from the deserializer 1418, a serializer 1414 for inputting serial data to driver 100, and data providing circuitry 1416 for inputting parallel data to serializer 1414. As in device 1400, the combination of the data receiving circuitry 1420 and deserializer 1418 represent one example design for a destination circuit 206, and the combination of the data providing circuitry 1416 and serializer 1414 represent one example design for a source circuit 202. Device 1402 also comprises clock input circuitry 1422 and an LVDS clock receiver 1430. The clock input circuitry 1422 receives the clock output from receiver 1430 and outputs control (CTL) to operate the providing circuitry 1416, serializer 1414, deserializer 1418, and receiving circuitry 1420. The control (CTL) signals output to the serializer and deserializer from the clock input circuit will operate faster than the control signals to the receiving and providing circuits since they will be controlling the higher speed serial input and output operations occurring over signal paths 514 and 516. The clock input circuit 1422 may employ use of clock and control signal modification circuits such as but not limited to; a phase lock loop, a phase shifter, a frequency divider, or a frequency multiplier. Receiver 1430 is similar to receiver 102 and inputs the LVDS clock outputs from device 1400 on signal paths 1424 and 1426. Device 1402 is assumed to be a slave device since it inputs the LVDS clock on signal paths 1424-1426.

During operation data is transmitted from the providing circuitry 1410 and serializer 1408 of device 1400 to the deserializer 1418 and receiving circuitry 1420 of device 1402. Simultaneous with data transmitted from device 1400 to device 1402, data is transmitted from the providing circuitry 1416 and serializer 1414 of device 1402 to the deserializer 1404 and receiving circuitry 1406 of device 1400. The simultaneous data transfers between devices 1400 and 1402 are controlled by clock output circuitry 1412 of device 1400 and the clock input circuitry 1422 of device 1402. As mentioned, internal to device 1400, clock output circuitry 1412 provides the control (CTL) inputs to operate the providing 1410, serializer 1408, deserializer 1404, and receiving 1406 circuits. External to the device, Clock output circuitry 1412 provides the LVDS clock input to device 1402. Internal to device 1402, and in response to the LVDS clock input from device 1400, the clock input circuitry 1422 provides the control (CTL) inputs to operate the providing 1416, serializer 1414, deserializer 1418, and receiving 1420 circuits.

Figure 15A:
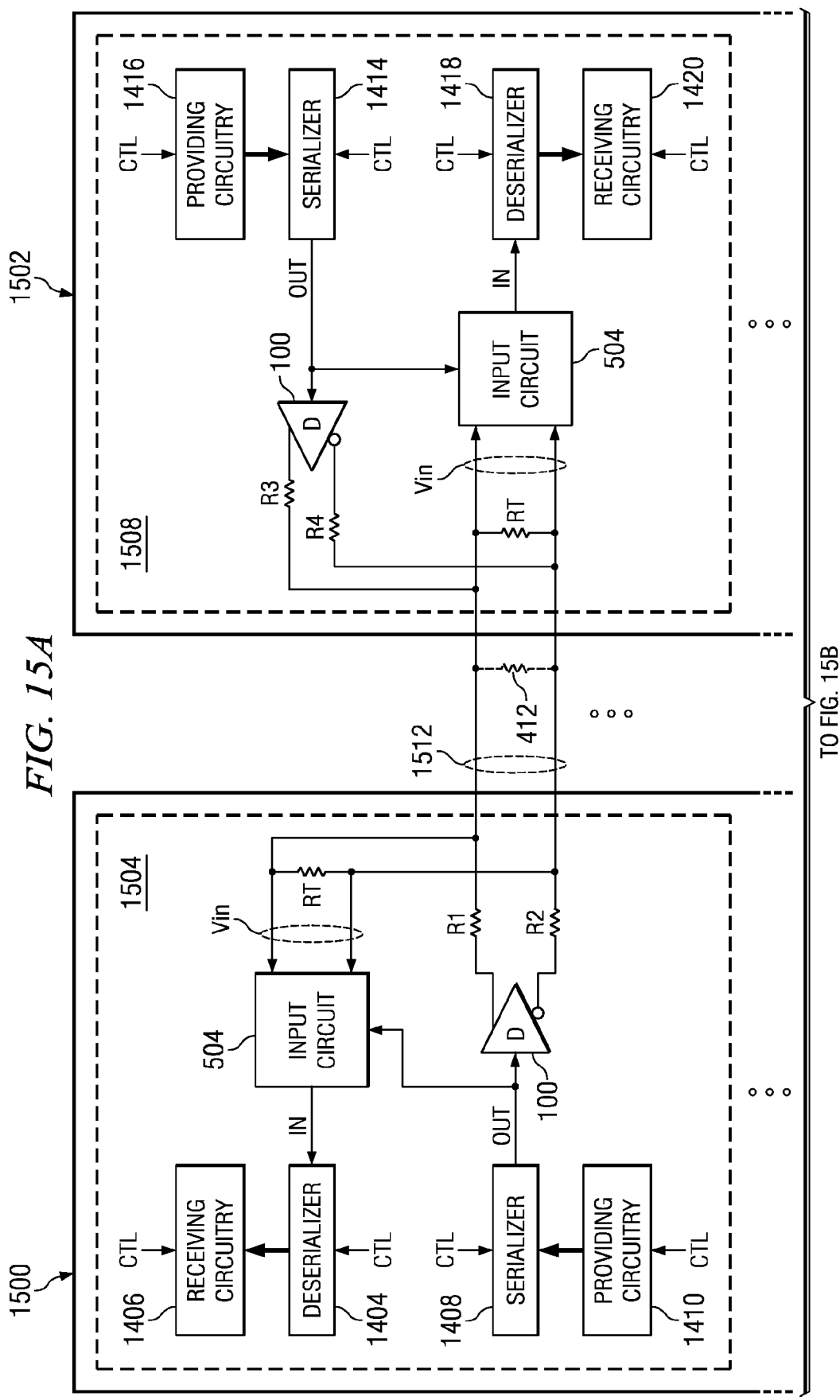
FIG. 15 illustrates an example of two device connected together via plural LVDS data signal paths and an LVDS clock signal path according to the present disclosure.
Figure 15B:
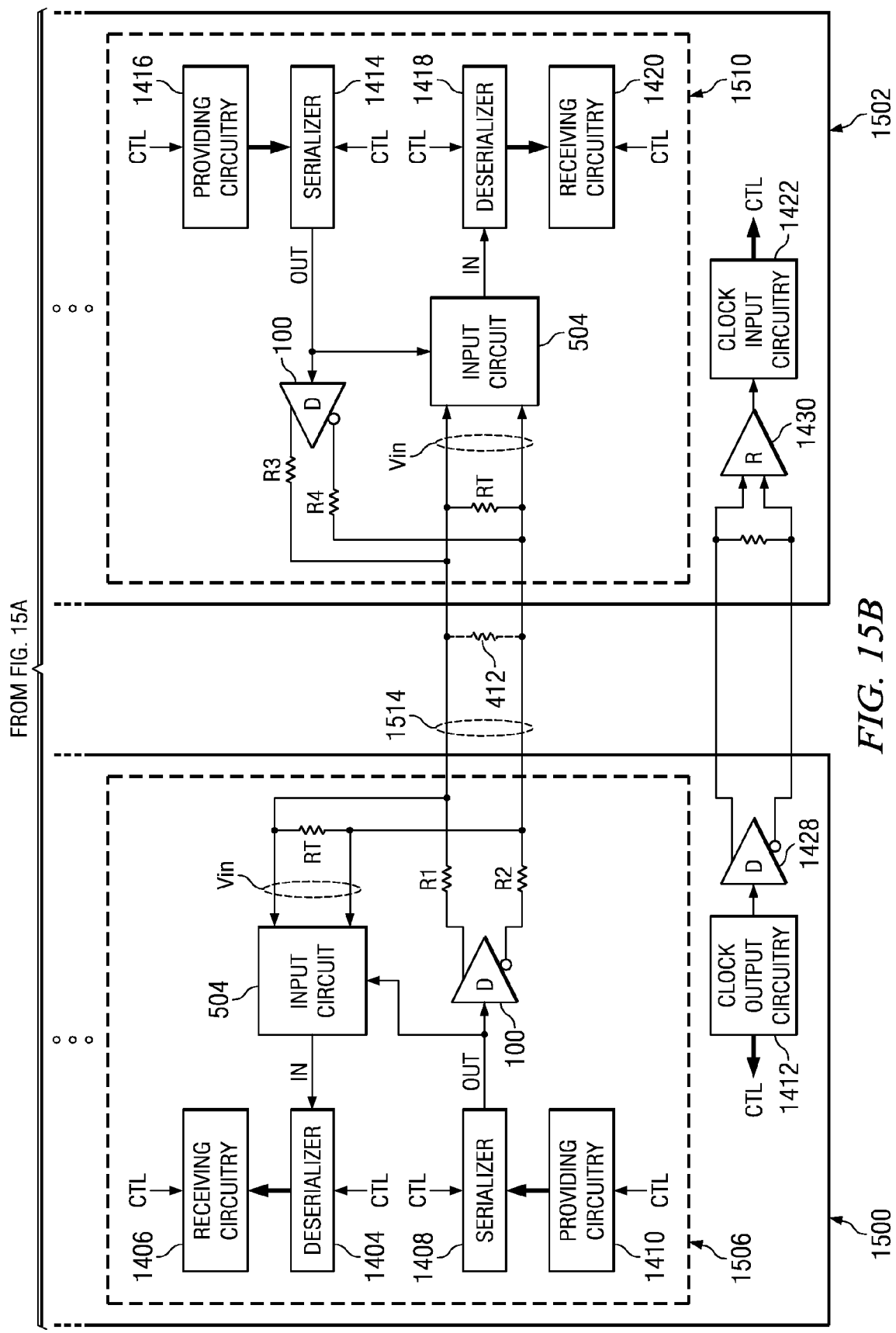

FIG. 15 is provided to indicate that a plurality of the providing (1410,1416), serializer (1408,1414), deserializer (1404,1418), and receiver (1406,1420) circuit arrangements 1504-1510 of FIG. 14 could exist in devices 1500 and 1502. Each arrangement 1504-1506 in device 1500 operable, in response to the clock output circuitry 1412 to communicate data simultaneously with an associated arrangement 1508-1510 in device 1502 via an input circuit 504, driver 100, resistors, and LVDS signal path 1512/1514.

FIG. 16 illustrates a device 1600 coupled to a debug, trace, or emulation controller 1610 via an LVDS signal path 1606 and LVDS clock path 1608 according to the present disclosure. The debug, trace, or emulation controller 1610 is similar in design to the master device 1400 of FIG. 14 with the exception that its specific function is to control a debug, trace, or emulation operation in device 1600 via the data and clock signal paths 1606 and 1608. Device 1600 is similar to the slave device 1402 of FIG. 14 with the exception that the providing circuit 1416 of FIG. 14 is indicated to be a memory or other circuit 1602 that needs to be controlled by device 1610 to output data during a debug, trace, or emulation operation, and the receiving circuit 1420 of FIG. 14 is indicated as being a memory or other circuit 1604 that needs to be controlled by device 1610 to input data during a debug, trace, or emulation operation.

Using the LVDS signaling approach of the present disclosure, much higher debug, trace, and/or emulation communication can occur between master device 1610 and slave device 1600, as opposed to other approaches used in the industry today. For example, it is well known to use the IEEE 1149.1 standard interface (i.e. JTAG) for debug, trace, and/or emulation operations. However, standard JTAG communication rates between a master and slave device is limited to around 50-100 MHz. Since the present disclosure uses LVDS signaling, the communication rates between a master 1610 and slave 1600 during debug, trace, and/or emulation operations can be greater than 400 MHz. Indeed, using the LVDS signaling approach of the present disclosure, communication for debug, trace, and/or emulation operations may well extend into the gigahertz range. Device 1600 can be extended, as shown in device 1502 of FIG. 15, to include a plurality of LVDS signal paths and associated driver 100, input circuits 504, serializer 1414 and deserializer 1418 such that high speed communication to greater number of debug, trace, and/or emulation circuits 1602 and 1604 is possible.

FIG. 17 is provided to indicate that a slave device 1700 may use a shift register 1702 during debug, trace, and/or emulation operations instead of a separate serializer 1414 (i.e. a serial in/parallel out circuit) and a separate deserializer 1418 (i.e. a parallel in/serial out circuit) if desired. In operation the shift register 1702 loads parallel debug, trace, and/or emulation data from circuit 1602 and shifts the data out to driver 100 as debug, trace, and/or emulation data is shifted in from input circuit 504 to be loaded in parallel to debug, trace, and/or emulation circuit 1604.

Figure 18:
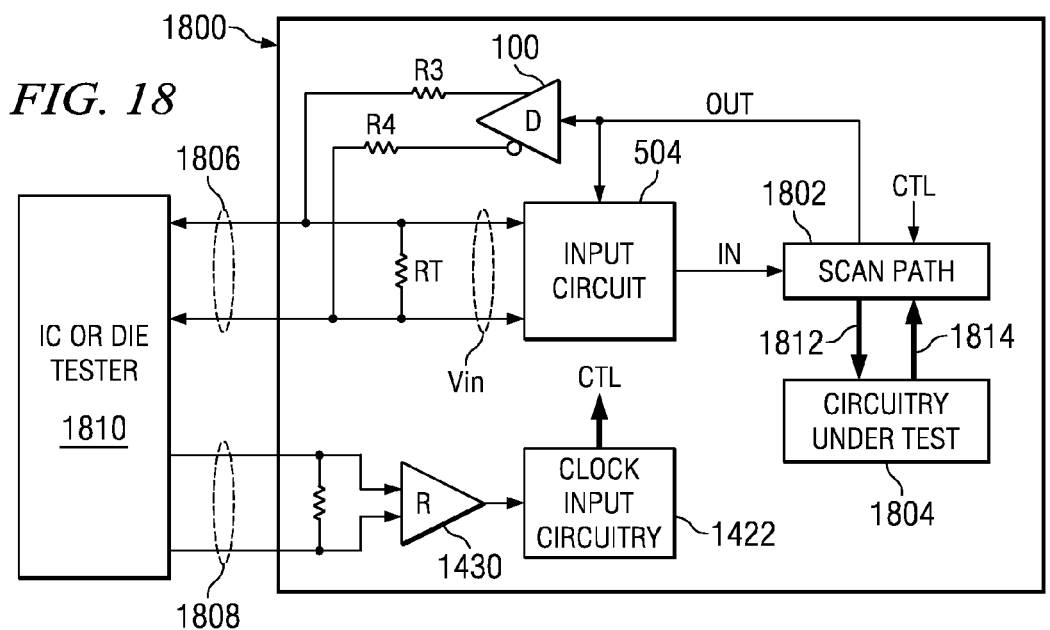
FIG. 18 illustrates an example of a device connected to an IC or die tester via an LVDS data signal path and an LVDS clock signal path according to the present disclosure.

FIG. 18 illustrates a device 1800 coupled to an IC or Die tester 1810 via an LVDS signal path 1806 and LVDS clock path 1808 according to the present disclosure. The tester 1810 is similar in design to the master device 1400 of FIG. 14 with the exception that its specific function is to control a test operation in device 1800 via the data and clock signal paths 1806 and 1808. Device 1800 is similar to the slave device 1402 of FIG. 14 with the exception that a scan path 1802 is coupled between the output of the input circuit 504 and the input of driver 100, and a circuit under test 1804 is shown coupled to the scan path 1802 to be the receiving 1420 and providing 1416 circuits during test operations. Device 1800 can be a packaged IC, an unpackaged IC die, or a die on wafer. The circuit under test 1804 is typically, but not limited to being, combinational logic. The serial data input to scan path 1802 from input circuit 504 is stimulus test data to be applied in parallel 1812 to the inputs of circuit under test 1804. The serial data output from scan path 1802 to driver 100 is response test data loaded in parallel 1814 to the scan register from the circuit under test outputs. Scan testing is well known. What is new is performing scan testing using the LVDS signaling approach of the present disclosure.

Using the LVDS signaling approach of the present disclosure, much higher test input and output communication can occur between master device 1810 and slave device 1800, as opposed to other approaches used in the industry today. For example, known scan interface used in the industry today (IEEE standards 1149.1 and 1500) are limited to scan test communication rates/frequencies of around 50-100 MHz. Since the present disclosure uses LVDS signaling, the communication rates between a master 1810 and slave 1800 during scan testing can be greater than 400 MHz. Indeed, using the LVDS signaling approach of the present disclosure, communication for scan test operations may well extend into the gigahertz range.

FIG. 19 illustrates a device 1900 coupled to an IC or Die tester 1912 via a plurality of LVDS signal paths 1906-1908 and an LVDS clock path 1910 according to the present disclosure. Each LVDS signal path 1906-1908 is coupled to an arrangement 1902-1904 of drivers 100, input circuits 504, scan paths 1802, and circuits under test 1804. The tester 11912 is similar to tester 1810 with the exception that it can communicate to the device 1900 over the plurality of LVDS signal paths 1906-1908, instead of the single LVDS signal path of FIG. 18. By increasing the number of LVDS signal paths and arrangements 1902-1904 a larger number of circuits 1804 can be tested in parallel, which decreases test time of device 1900.

Figure 20:
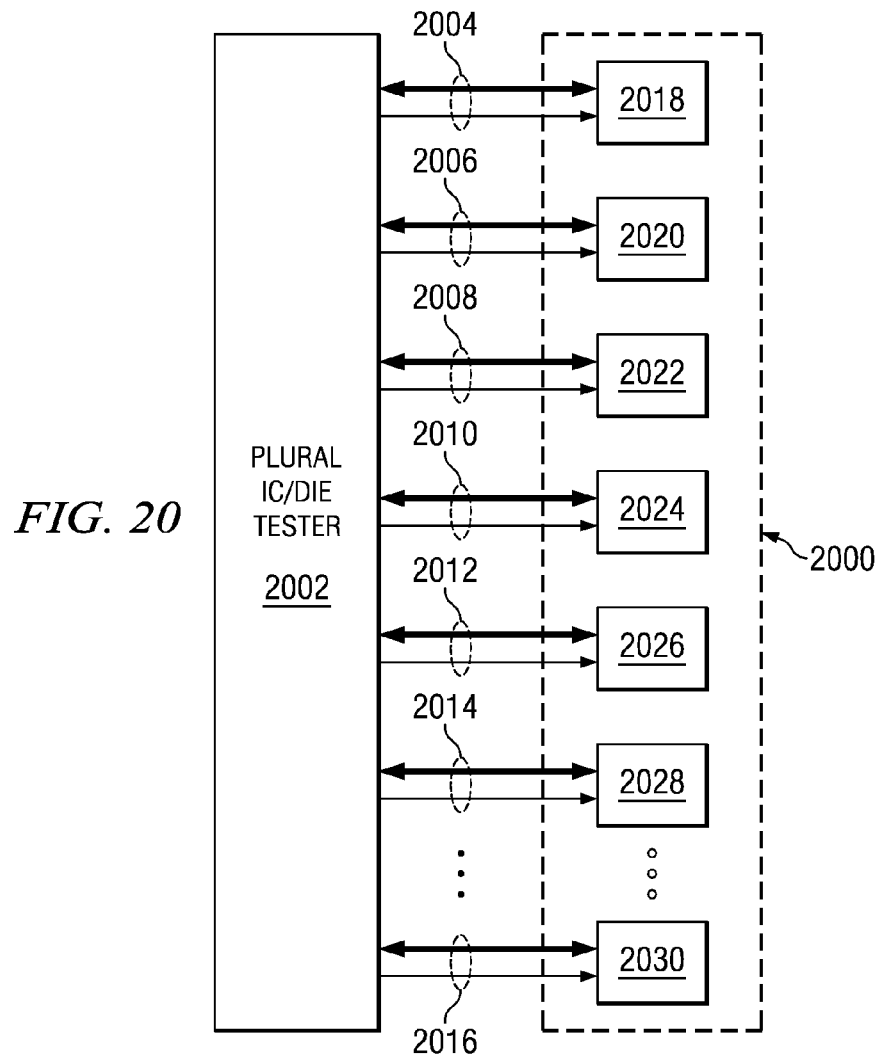
FIG. 20 illustrates an example of a plurality of devices connected to an IC or die tester via LVDS data signal paths and LVDS clock signal paths according to the present disclosure.

FIG. 20 illustrates either a plurality or ICs 2018-2030 in a fixture 2000 or a plurality of die 2018-2030 on a wafer 2000 interfaced to a plural IC or die tester 2002 via LVDS data and clock signal paths 2004-2016. If the IC or die 2018-2030 are the type shown in FIG. 18, there will be one LVDS data signal path pair and one LVDS clock signal path pair between the tester 2002 and each IC or die 2018-2030. If the IC or die 2018-2030 are the type shown in FIG. 19, there will be one LVDS clock signal path pair and a plurality of LVDS data signal path pairs (indicated by increased line width) between the tester 2002 and each IC or die 2018. FIG. 20 illustrates how a plurality of ICs 2018-2030 in a fixture 2000 or a plurality of die 2018-2030 on a wafer 2000 may be scan tested in parallel (i.e. at the same time) using the LVDS signaling approach of the present disclosure.

While FIGS. 18-20 have illustrated the LVDS signaling approach of the present disclosure for testing ICs or die using a scan test approach, other test approaches may be interfaced to the LVDS signaling approach of the present disclosure as well. Other test approaches that may be interfaced to the LVDS signaling interface of the present disclosure may include but are not limited to, (1) a test approach based on IEEE standard 1149.1, (2) a test approach based on IEEE standard 1149.4, (3) a test approach based on IEEE standard 1149.6, (4) a test approach based on IEEE standard 1500, (5) a test approach based on built in self test, and (6) a test approach based on functional testing.

Although the present disclosure has been described in detail, it should be understood that various changes, substitutions and alterations may be made without departing from the spirit and scope of the disclosure as defined by the appended claims.

I claim:

1. An LVDS comparator circuit comprising:
   A. a first LVDS signal path;
   B. a second LVDS signal path;
   C. a first comparator having a non-inverting input connected to the first LVDS signal path, an inverting input connected to the second LVDS signal path, and an output, the first comparator having an offset voltage between the non-inverting and inverting inputs;
   D. a second comparator having a non-inverting input connected to the second LVDS signal path, an inverting input connected to the first LVDS signal path, and an output, the second comparator having an offset voltage between the non-inverting and inverting inputs substantially equal to the offset voltage of the first comparator;
   E. an OR gate having one input connected to the output of the first comparator, another input connected to the output of the second comparator, and an output; and
   F. a multiplexer having a control input connected to the output of the OR gate.

2. The LVDS comparator circuit of claim 1 including a third comparator having a non-inverting input connected to the first LVDS signal path, and an inverting input connected to the second LVDS signal path.

3. The LVDS comparator circuit of claim 1 including a resistor connected across the first and second LVDS signal paths.

4. The LVDS comparator circuit of claim 1 including two LVDS driver circuits connected to the first and second LVDS signal paths.

5. The LVDS comparator circuit of claim 1 including another LVDS comparator circuit connected with the first and second LVDS signal paths.

* * * * *